(12) United States Patent
Niermeyer et al.

(10) Patent No.: US 7,946,751 B2
(45) Date of Patent: May 24, 2011

(54) METHOD FOR CONTROLLED MIXING OF FLUIDS VIA TEMPERATURE

(75) Inventors: J. Karl Niermeyer, Tyngsboro, MA (US); Robert F. McLoughlin, Pelham, NH (US); Joseph E. Smith, North Andover, MA (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 12/350,688

(22) Filed: Jan. 8, 2009

(65) Prior Publication Data
US 2009/0116334 A1 May 7, 2009

Related U.S. Application Data

(62) Division of application No. 11/386,427, filed on Mar. 22, 2006, now Pat. No. 7,494,265, which is a division of application No. 11/365,395, filed on Mar. 1, 2006, now Pat. No. 7,684,446.

(51) Int. Cl.
*B01F 15/04* (2006.01)

(52) U.S. Cl. ........................ 366/152.1; 366/160.1; 137/3

(58) Field of Classification Search .................. 366/132, 366/134, 136, 137, 150.1–153.1, 160.1–162.1; 137/88–93, 896–898, 3; 700/265–266, 285
See application file for complete search history.

(56) References Cited

U.S. PATENT DOCUMENTS

| | | | |
|---|---|---|---|
| 269,626 A | 12/1882 | Bodel et al. | |
| 826,018 A | 7/1906 | Concoff | |
| 1,664,125 A | 3/1928 | Lowrey | |
| 2,153,664 A | 4/1939 | Freedlander | |
| 2,215,505 A | 9/1940 | Hollander | |
| 2,328,468 A | 8/1943 | Laffly | |
| 2,457,384 A | 12/1948 | Krenz | |
| 2,631,538 A | 3/1953 | Johnson | |
| 2,673,522 A | 3/1954 | Dickey | |
| 2,757,966 A | 8/1956 | Samiran | |
| 3,072,058 A | 1/1963 | Christopher et al. | |
| 3,227,279 A | 1/1966 | Bokelman | |
| 3,327,635 A | 6/1967 | Sachnik | |
| 3,623,661 A | 11/1971 | Wagner | |
| 3,741,298 A | 6/1973 | Canton | |
| 3,895,748 A | 7/1975 | Klingenberg | |

(Continued)

FOREIGN PATENT DOCUMENTS

AU 78872/87 4/1988

(Continued)

OTHER PUBLICATIONS

Furon Co., "Chempure Pump-A Furon Product" Brochure, 1996, Anaheim, CA, US, 2 pages.

(Continued)

*Primary Examiner* — Charles E Cooley
(74) *Attorney, Agent, or Firm* — Sprinkle IP Law Group

(57) ABSTRACT

Embodiments of the present invention provide a method for continuous flow production of mixed fluids. The mixed fluids can comprise a mixture of different fluids or a mixture of the same fluid having different input properties such as temperature. In general, two streams of fluid of varying temperature are supplied to a mixer. The flow rate of each of the input fluids can be regulated to produce a mixed fluid at a desired flow rate and temperature. As an example, mass flow controllers can regulate the flow rates of a hot and cold stream of de-ionized water to produce a stream of de-ionized water at a desired flow rate and temperature.

20 Claims, 18 Drawing Sheets

U.S. PATENT DOCUMENTS

| | | | |
|---|---|---|---|
| 3,954,352 A | 5/1976 | Sakai | |
| 4,023,592 A | 5/1977 | Patzke et al. | |
| 4,093,403 A | 6/1978 | Schrimpf | |
| 4,420,811 A * | 12/1983 | Tarnay et al. | 700/285 |
| 4,452,265 A * | 6/1984 | Lonnebring | 137/4 |
| 4,475,818 A * | 10/1984 | Bialkowski | 366/17 |
| 4,483,665 A | 11/1984 | Hauser | |
| 4,541,455 A | 9/1985 | Hauser | |
| 4,597,719 A | 7/1986 | Tano et al. | |
| 4,597,721 A | 7/1986 | Santefort | |
| 4,601,409 A | 7/1986 | DiRegolo | |
| 4,614,438 A * | 9/1986 | Kobayashi | 366/132 |
| 4,671,545 A | 6/1987 | Miyazaki | |
| 4,690,621 A | 9/1987 | Swain | |
| 4,705,461 A | 11/1987 | Clements | |
| 4,739,923 A * | 4/1988 | Tsutsui et al. | 236/12.12 |
| 4,797,834 A | 1/1989 | Honganen et al. | |
| 4,808,077 A | 2/1989 | Kan et al. | |
| 4,810,168 A | 3/1989 | Nogami et al. | |
| 4,821,997 A | 4/1989 | Zdeblick | |
| 4,824,073 A | 4/1989 | Zdeblick | |
| 4,865,525 A | 9/1989 | Kern | |
| 4,875,623 A * | 10/1989 | Garris | 236/12.12 |
| 4,913,624 A | 4/1990 | Seki et al. | |
| 4,915,126 A | 4/1990 | Gyllinder | |
| 4,915,160 A * | 4/1990 | Reynolds | 164/456 |
| 4,943,032 A | 7/1990 | Zdeblick | |
| 4,950,134 A | 8/1990 | Bailey et al. | |
| 4,952,386 A | 8/1990 | Davison | |
| 4,966,646 A | 10/1990 | Zdeblick | |
| 4,969,598 A * | 11/1990 | Garris | 236/12.12 |
| 5,050,062 A * | 9/1991 | Hass | 700/32 |
| 5,061,156 A | 10/1991 | Kuehne et al. | |
| 5,061,574 A | 10/1991 | Henager, Jr. et al. | |
| 5,062,770 A | 11/1991 | Story | |
| 5,134,962 A | 8/1992 | Amada | |
| 5,135,031 A | 8/1992 | Burgess | |
| 5,167,837 A | 12/1992 | Snodgrass et al. | |
| 5,170,361 A * | 12/1992 | Reed | 700/283 |
| 5,192,198 A | 3/1993 | Gebauer et al. | |
| 5,261,442 A | 11/1993 | Kingsford et al. | |
| 5,262,068 A | 11/1993 | Bowers et al. | |
| 5,316,181 A | 5/1994 | Burch | |
| 5,332,311 A * | 7/1994 | Volk et al. | 366/134 |
| 5,344,195 A | 9/1994 | Parimore, Jr. et al. | |
| 5,350,200 A | 9/1994 | Peterson et al. | |
| 5,380,019 A | 1/1995 | Hillery et al. | |
| 5,434,774 A | 7/1995 | Seberger | |
| 5,476,004 A | 12/1995 | Kingsford | |
| 5,490,765 A | 2/1996 | Bailey et al. | |
| 5,511,797 A | 4/1996 | Nikirk et al. | |
| 5,516,429 A | 5/1996 | Snodgrass et al. | |
| 5,527,161 A | 6/1996 | Bailey et al. | |
| 5,546,009 A | 8/1996 | Raphael | |
| 5,575,311 A | 11/1996 | Kingsford | |
| 5,580,103 A | 12/1996 | Hall | |
| 5,599,100 A * | 2/1997 | Jackson et al. | 366/152.5 |
| 5,599,394 A | 2/1997 | Yabe | |
| 5,645,301 A | 7/1997 | Kingsford et al. | |
| 5,652,391 A | 7/1997 | Kingsford et al. | |
| 5,653,251 A | 8/1997 | Handler | |
| 5,743,293 A | 4/1998 | Kelly | |
| 5,762,795 A | 6/1998 | Bailey et al. | |
| 5,772,899 A | 6/1998 | Snodgras et al. | |
| 5,784,573 A | 7/1998 | Szczepanek et al. | |
| 5,785,508 A | 7/1998 | Bolt | |
| 5,793,754 A | 8/1998 | Houldsworth et al. | |
| 5,839,828 A | 11/1998 | Glanville | |
| 5,848,605 A | 12/1998 | Bailey et al. | |
| 5,947,702 A | 9/1999 | Biederstadt | |
| 5,971,723 A | 10/1999 | Bolt et al. | |
| 5,991,279 A | 11/1999 | Haugli et al. | |
| 6,033,302 A | 3/2000 | Ahmed et al. | |
| 6,105,829 A | 8/2000 | Snodgrass et al. | |
| 6,190,565 B1 | 2/2001 | Bailey et al. | |
| 6,238,576 B1 | 5/2001 | Yajima | |
| 6,250,502 B1 | 6/2001 | Cote et al. | |
| 6,251,293 B1 | 6/2001 | Snodgrass et al. | |
| 6,302,660 B1 | 10/2001 | Kurita et al. | |
| 6,318,971 B1 | 11/2001 | Ota | |
| 6,325,032 B1 | 12/2001 | Sekiya et al. | |
| 6,325,932 B1 | 12/2001 | Gibson | |
| 6,330,517 B1 | 12/2001 | Dobrowskii | |
| 6,348,124 B1 | 2/2002 | Garbett | |
| 6,474,950 B1 | 11/2002 | Waldo | |
| 6,478,547 B1 | 11/2002 | Savard et al. | |
| 6,506,030 B1 | 1/2003 | Kottke | |
| 6,540,265 B2 | 4/2003 | Turk | |
| 6,554,579 B2 | 4/2003 | Martin et al. | |
| 6,572,255 B2 * | 6/2003 | Husher | 366/132 |
| 6,592,825 B2 | 7/2003 | Pelc | |
| 6,635,183 B2 | 10/2003 | Gibson | |
| 6,742,992 B2 | 6/2004 | Davis | |
| 6,742,993 B2 | 6/2004 | Savard et al. | |
| 6,766,810 B1 | 7/2004 | Van Cleemput | |
| 6,767,877 B2 | 7/2004 | Kuo | |
| 6,837,484 B2 | 1/2005 | Kingsford et al. | |
| 6,901,791 B1 | 6/2005 | Frenz et al. | |
| 6,923,568 B2 * | 8/2005 | Wilmer et al. | 366/152.1 |
| 6,925,072 B1 | 8/2005 | Grohn | |
| 6,952,618 B2 * | 10/2005 | Davlin et al. | 700/3 |
| 7,013,223 B1 | 3/2006 | Zhang et al. | |
| 7,029,238 B1 | 4/2006 | Zagars et al. | |
| 7,063,785 B2 | 6/2006 | Hiraku et al. | |
| 7,083,202 B2 | 8/2006 | Eberle et al. | |
| 7,156,115 B2 * | 1/2007 | Everett et al. | 137/3 |
| 7,247,245 B1 | 7/2007 | Proulx et al. | |
| 7,249,628 B2 | 7/2007 | Pillion et al. | |
| 7,272,452 B2 | 9/2007 | Coogan et al. | |
| 7,383,967 B2 | 6/2008 | Gibson | |
| 7,454,317 B2 | 11/2008 | Karasawa | |
| 7,476,087 B2 | 1/2009 | Zagars et al. | |
| 7,494,265 B2 * | 2/2009 | Niermeyer et al. | 366/152.4 |
| 7,547,049 B2 | 6/2009 | Gashgaee | |
| 7,660,648 B2 * | 2/2010 | Dykstra | 700/285 |
| 7,684,446 B2 | 3/2010 | McLoughlin | |
| 2002/0044536 A1 | 4/2002 | Izumi et al. | |
| 2002/0095240 A1 | 7/2002 | Sickinger | |
| 2003/0033052 A1 | 2/2003 | Hillen et al. | |
| 2003/0040881 A1 | 2/2003 | Steger et al. | |
| 2003/0148759 A1 | 8/2003 | Leliveid | |
| 2003/0222798 A1 | 12/2003 | Floros | |
| 2004/0050771 A1 | 3/2004 | Gibson | |
| 2004/0057334 A1 * | 3/2004 | Wilmer et al. | 366/136 |
| 2004/0072450 A1 | 4/2004 | Collins | |
| 2004/0133728 A1 | 7/2004 | Ellerbrock et al. | |
| 2005/0061722 A1 | 3/2005 | Takao et al. | |
| 2005/0113941 A1 | 5/2005 | Ii et al. | |
| 2005/0126985 A1 | 6/2005 | Campbell | |
| 2005/0182497 A1 | 8/2005 | Nakano | |
| 2005/0184087 A1 | 8/2005 | Zagars | |
| 2005/0197722 A1 | 9/2005 | Varone et al. | |
| 2005/0232296 A1 | 10/2005 | Schultze et al. | |
| 2005/0238497 A1 | 10/2005 | Holst | |
| 2006/0015294 A1 | 1/2006 | Yetter et al. | |
| 2006/0070960 A1 | 4/2006 | Gibson | |
| 2006/0083259 A1 | 4/2006 | Metcalf et al. | |
| 2007/0104586 A1 | 5/2007 | Cedrone | |
| 2007/0125796 A1 | 6/2007 | Cedrone | |
| 2007/0125797 A1 | 6/2007 | Cedrone | |
| 2007/0126233 A1 | 6/2007 | Gashgaee | |
| 2007/0127511 A1 | 6/2007 | Cedrone | |
| 2007/0128046 A1 | 6/2007 | Gonnella | |
| 2007/0128047 A1 | 6/2007 | Gonnella | |
| 2007/0128050 A1 | 6/2007 | Cedrone | |
| 2007/0206436 A1 * | 9/2007 | Niermeyer et al. | 366/152.4 |
| 2007/0217442 A1 | 9/2007 | McLoughlin | |
| 2007/0251596 A1 * | 11/2007 | Scherzer et al. | 141/2 |
| 2008/0089361 A1 | 4/2008 | Metcalf et al. | |
| 2008/0131290 A1 | 6/2008 | Magoon et al. | |
| 2009/0047143 A1 | 2/2009 | Cedrone | |
| 2009/0116334 A1 * | 5/2009 | Niermeyer et al. | 366/145 |
| 2009/0157229 A1 | 6/2009 | Rulkens et al. | 700/267 |
| 2011/0044125 A1 * | 2/2011 | Kurosawa et al. | 366/152.2 |

FOREIGN PATENT DOCUMENTS

| | | |
|---|---|---|
| CA | 1271140 | 7/1990 |
| CN | 1331783 A | 1/2002 |
| DE | 299 09 100 U1 | 8/1999 |
| EP | 0249655 A | 12/1987 |
| EP | 0410394 A | 1/1991 |
| EP | 0261972 B1 | 12/1992 |
| EP | 0892204 A2 | 1/1998 |
| EP | 0863538 A | 9/1998 |
| EP | 0867649 A3 | 9/1998 |
| EP | 1133639 B1 | 6/2004 |
| GB | 661 522 A | 11/1951 |
| JP | 58203340 A | 11/1983 |
| JP | 11 026430 A | 1/1999 |
| JP | 2009-517601 | 4/2009 |
| JP | 2009-517618 | 4/2009 |
| JP | 2009-517778 | 4/2009 |
| JP | 2009-517888 | 4/2009 |
| JP | 2009-521636 | 6/2009 |
| WO | 96/35876 A | 11/1996 |
| WO | WO 99/37435 | 7/1999 |
| WO | WO 9906514 A1 | 12/1999 |
| WO | WO 00/31416 A1 | 6/2001 |
| WO | WO 01/40646 A3 | 6/2001 |
| WO | WO 02/090771 A2 | 11/2002 |
| WO | WO 03068086 | 8/2003 |
| WO | 03/087675 A1 * | 10/2003 |
| WO | WO 2006/057957 A2 | 6/2006 |
| WO | WO2006084443 A1 | 8/2006 |
| WO | WO2006104538 A1 | 10/2006 |
| WO | WO2007041265 A1 | 4/2007 |
| WO | WO2007050373 A2 | 5/2007 |
| WO | WO 2007067359 A2 | 6/2007 |
| WO | WO2007087486 A1 | 8/2007 |

OTHER PUBLICATIONS

Krishna, "Characterization of Low Viscosity Photoresist Coating," Proceedings of SPIE, Advances in Resist Tech. and Processing XV, Feb. 23-25, 1998, SPIE vol. 3333/1323-36.
Chinese Patent Office Official Action, Chinese Patent Application No. 200410079193.0.
International Search Report and Written Opinion, PCT/US2006/045127, dated May 23, 2007.
International Search Report and Written Opinion, PCT/US2006/044908, dated Jul. 16, 2007.
International Search Report and Written Opinion, PCT/US2006/045175, dated Jul. 25, 2007.
International Search Report and Written Opinion, PCT/US2006/044907, dated Aug. 8, 2007.
International Search Report and Written Opinion, PCT/US2006/045177, dated Aug. 9, 2007.
European Patent Office Official Action, European Patent Application No. 00982386.5, dated Sep. 3, 2007.
International Search Report and Written Opinion, PCT/US2006/044906, dated Sep. 5, 2007.
International Search Report and Written Opinion, PCT/US2005/042127, dated Sep. 26, 2007.
International Search Report and Written Opinion, PCT/US2006/044980, dated Oct. 4, 2007.
United States Patent Office Official Action issued in U.S. Appl. No. 11/051,576, dated Dec. 13, 2007.
International Search Report and Written Opinion PCT/US2006/045176, dated Apr. 21, 2008.
Office Action issued in U.S. Appl. No. 11/602,513, dated May 22, 2008.
International Search Report and Written Opinion issued in PCT/US2007/05377 dated Jun. 4, 2008.
Chinese Patent Office Official Action, Chinese Patent Application No. 2005101088364, dated May 23, 2008.
International Search Report and Written Opinion issued in PCT/US06/44985, dated Jun. 23, 2008.
International Search Report and Written Opinion issued in PCT/US07/17017, dated Jul. 3, 2008.
International Search Report and Written Opinion issued in PCT/US06/44981, dated Aug. 8, 2008, 10 pages.
Office Action issued in U.S. Appl. No. 11/365,395, dated Aug. 19, 2008, McLoughlin, 20 pages.
Office Action issued in U.S. Appl. No. 11/292,559, dated Aug. 28, 2008, Gonnella, 19 pages.
Office Action issued in U.S. Appl. No. 11/602,513, dated Nov. 14, 2008, McLoughlin, 7 pages.
Report Information from Dialog Datastar, Thomson Dialog, 10 pages, dated Aug. 4, 2008.
Report Information from Dialog Datastar, Thomson Dialog, 6 pages, dated Aug. 4, 2008.
Intellectual Property Office of Singapore, Written Opinion issued in Patent Application No. 200803948-9 dated Jan. 19, 2010, 10 pgs.
Office Action issued in U.S. Appl. No. 11/364,286, dated Nov. 14, 2008, Gonnella, 11 pages.
Notification of Transmittal of International Preliminary Report on Patentability for PCT/US07/17017 dated Jan. 13, 2009, 8 pages.
International Preliminary Report on Patentability, Chap. I, issued in PCT/US2006/044981, mailed Nov. 6, 2008, 7 pages.
International Preliminary Report on Patentability, Chap. II, issued in PCT/US2006/044981, mailed Feb. 2, 2009, 9 pages.
Office Action issued in U.S. Appl. No. 11/365,395, mailed Feb. 2, 2009, McLoughlin, 18 pages.
Office Action issued in U.S. Appl. No. 11/292,559, mailed Dec. 24, 2008, Gonnella, 18 pages.
Office Action issued Chinese Patent Appl. No. 200680050665.7, dated Mar. 11, 2010, (with English translation) 6 pgs.
Office Action issued in U.S. Appl. No. 11/364,286 mailed Apr. 7, 2010, 23 pgs.
International Preliminary Report on Patentability, Chapter I, and Written Opinion issued in PCT/US2006/044985, mailed Jun. 23, 2008, 5 pages.
Office Action issued in U.S. Appl. No. 11/292,559, mailed Apr. 17, 2009, Gonnella, 20 pages.
Office Action issued in U.S. Appl. No. 11/273,091, mailed Feb. 17, 2006, Gibson, 8 pages.
Office Action issued in U.S. Appl. No. 11/273,091, mailed Jul. 3, 2006, Gibson, 8 pages.
Office Action issued in U.S. Appl. No. 11/273,091, mailed Oct. 13, 2006, Gibson, 8 pages.
Office Action issued in U.S. Appl. No. 11/273,091, mailed Feb. 23, 2007, Gibson, 6 pages.
Office Action issued in U.S. Appl. No. 11/273,091, mailed Oct. 15, 2007, Gibson, 8 pages.
Office Action issued in U.S. Appl. No. 11/386,427, mailed Nov. 13, 2007, Niermeyer, 11 pages.
Office Action issued in U.S. Appl. No. 11/364,286 mailed Jun. 1, 2009, Gonnella, 14 pgs.
Patent Cooperation Treaty, International Preliminary Report on Patentability and Written Opinion, Ch. I, issued in PCT/US2006/045176 dated Apr. 9, 2009, Entegris, Inc., 5 pages.
Intellectual Property Office of Singapore, Written Opinion issued in Patent Application No. 200803948-9 dated Jul. 2, 2009, Entegris, Inc., 10 pages.
International Search Report, PCT/US99/28002, mailed Mar. 14, 2000, 5 pgs.
Written Opinion issued in PCT/US99/28002, mailed Oct. 25, 2000, 8 pgs.
International Preliminary Examination Report, PCT/US99/28002, mailed Feb. 21, 2001, 9 pgs.
International Search Report and Written Opinion, PCT/US06/44907, mailed Aug. 8, 2007, 9 pgs.
International Preliminary Report on Patentability, Ch. I, PCT/US2006/044906, mailed Jun. 5, 2008, 7 pgs.
International Preliminary Report on Patentability, Ch. I, PCT/US2006/044907, mailed Jun. 5, 2008, 7 pgs.
International Preliminary Report on Patentability, Ch. I, PCT/US2006/044980, mailed Jun. 12, 2008, 7 pgs.
International Preliminary Report on Patentability, Ch. I, PCT/US2006/044908, mailed Jun. 12, 2008, 8 pgs.
International Preliminary Report on Patentability, Ch. I, PCT/US2006/045175, mailed Jun. 12, 2008, 6 pgs.

International Preliminary Report on Patentability, Ch. I, PCT/US2006/045127, mailed Jun. 12, 2008, 8 pgs.

International Preliminary Report on Patentability, Ch. I, PCT/US2006/045177, mailed Jun. 12, 2008, 5 pgs.

International Preliminary Report on Patentability, Ch. II, PCT/US2007/05377, mailed Oct. 14, 2008, 14 pgs.

European Search Report, European Application No. 06838223.3, dated Aug. 12, 2009, 8 pgs.

Japanese Laid Open Publication No. JP-2009-528631, published Aug. 6, 2009, with International Search Report, Japanese Patent Office, 38 pgs.

Office Action issued in U.S. Appl. No. 09/447,504, mailed Feb. 27, 2001, 4 pgs.

Office Action issued in U.S. Appl. No. 09/447,504, mailed Nov. 18, 2003, 4 pgs.

Office Action issued in U.S. Appl. No. 09/447,504, mailed Jul. 13, 2004, 5 pgs.

Japanese Laid Open Publication No. JP-2009-529847, published Aug. 20, 2009, with International Search Report, Japanese Patent Office, 21 pgs.

Intellectual Property Office of Singapore, Written Opinion issued in Patent Application No. 200703671-8, dated Jul. 20, 2009, 4 pgs.

Chinese Patent Office Official Action, Chinese Patent Application No. 200580039961.2, dated Aug. 21, 2009 with English translation, 33 pgs.

Intellectual Property Office of Singapore, Written Opinion issued in Patent Application No. 200806425-5 dated Oct. 14, 2009, 8 pgs.

Office Action issued in U.S. Appl. No. 11/602,507 mailed Oct. 28, 2009, 12 pgs.

Office Action issued in U.S. Appl. No. 11/292,559 mailed Nov. 3, 2009, 17 pgs.

Office Action issued in U.S. Appl. No. 11/364,286 mailed Nov. 9, 2009, 19 pgs.

Intellectual Property Office of Singapore, Written Opinion issued in Patent Application No. 200806425-5 dated Jun. 14, 2010, Entegris, Inc., 6 pages.

Office Action issued in U.S. Appl. No. 11/292,559 mailed Apr. 14, 2010, 20 pgs.

Office Action issued in U.S. Appl. No. 11/602,508 mailed Apr. 15, 2010, 20 pgs.

Office Action issued in Chinese Patent Application No. CN 200680050801.2, mailed Mar. 26, 2010, 13 pgs. (with English translation).

* cited by examiner

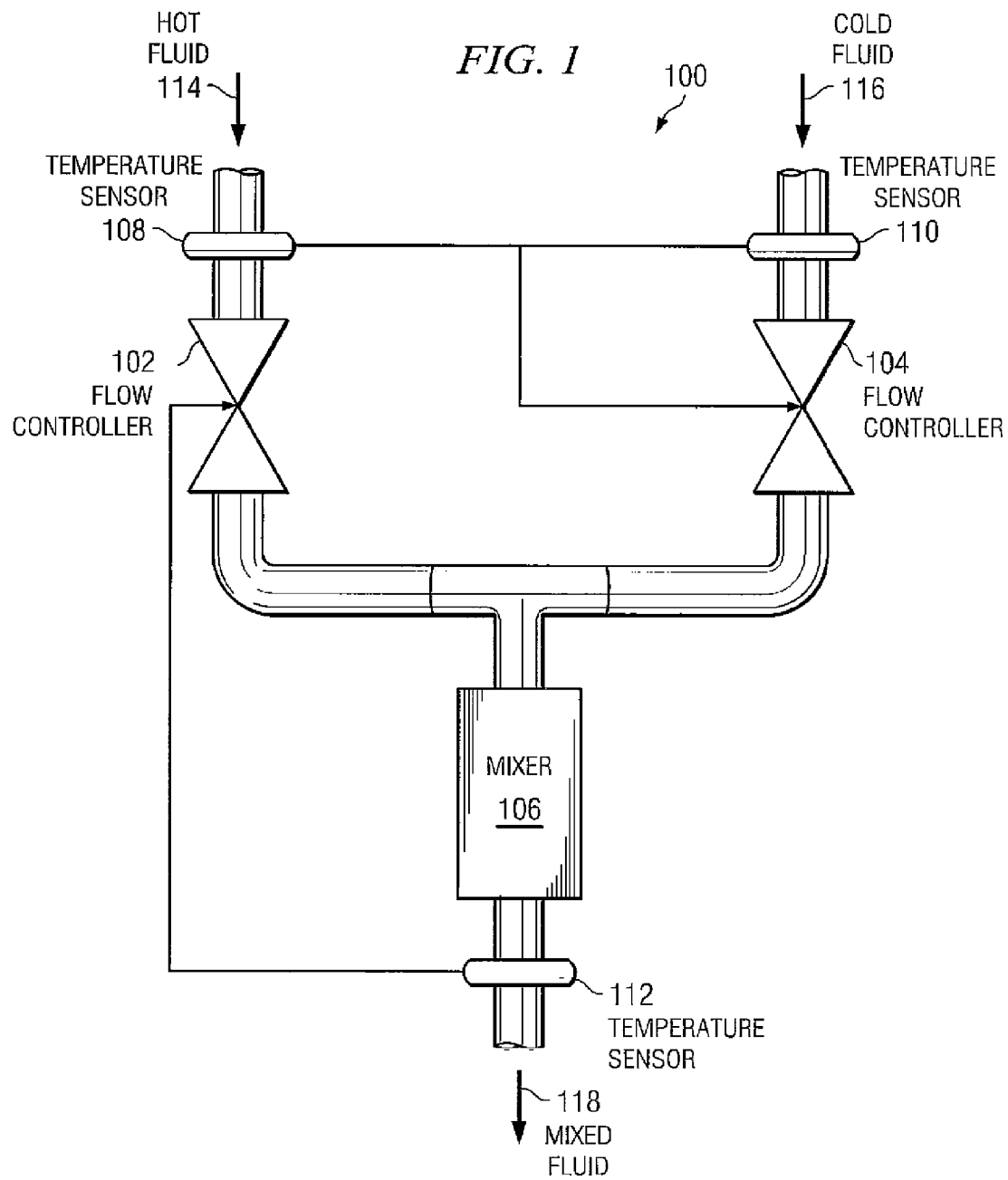

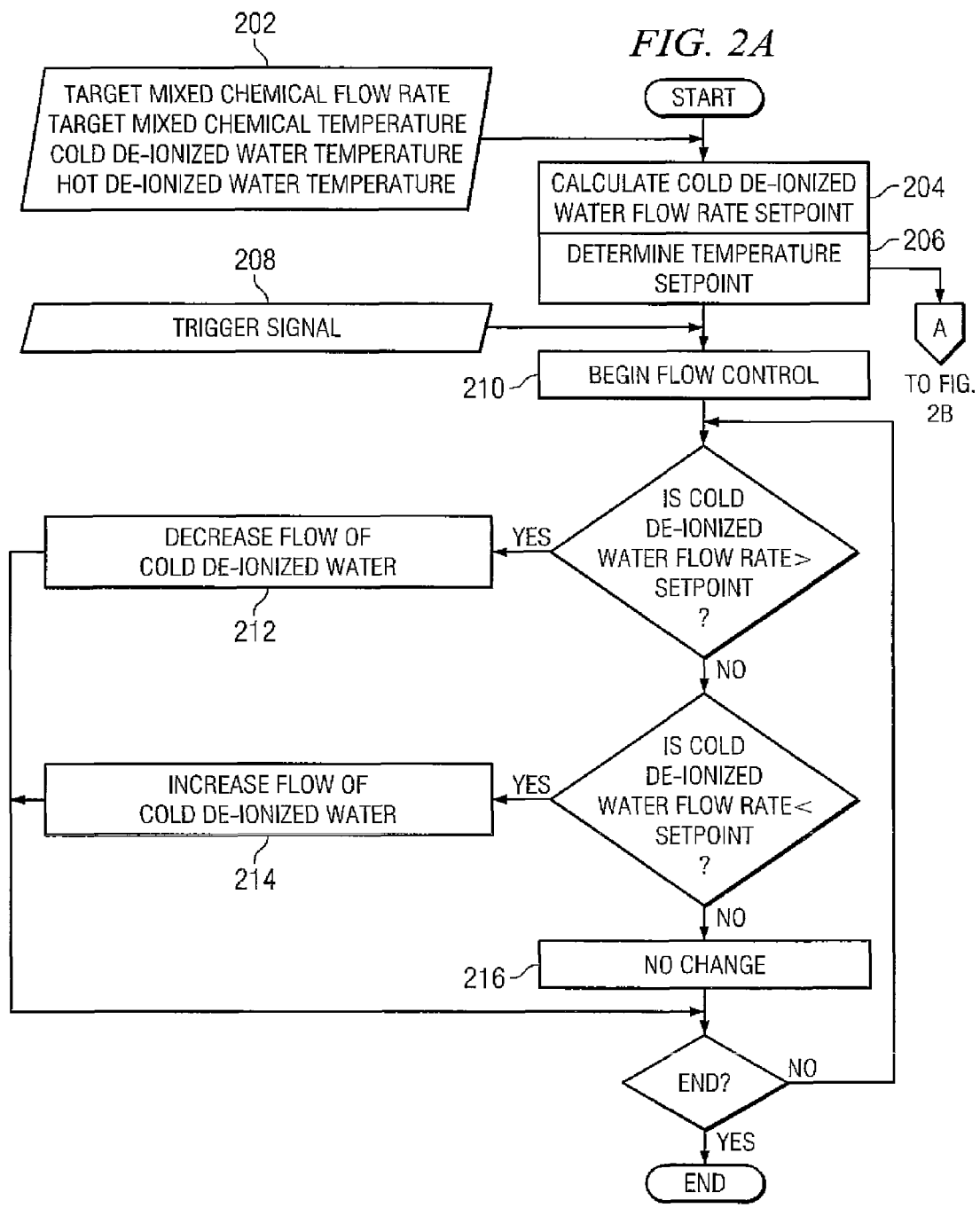

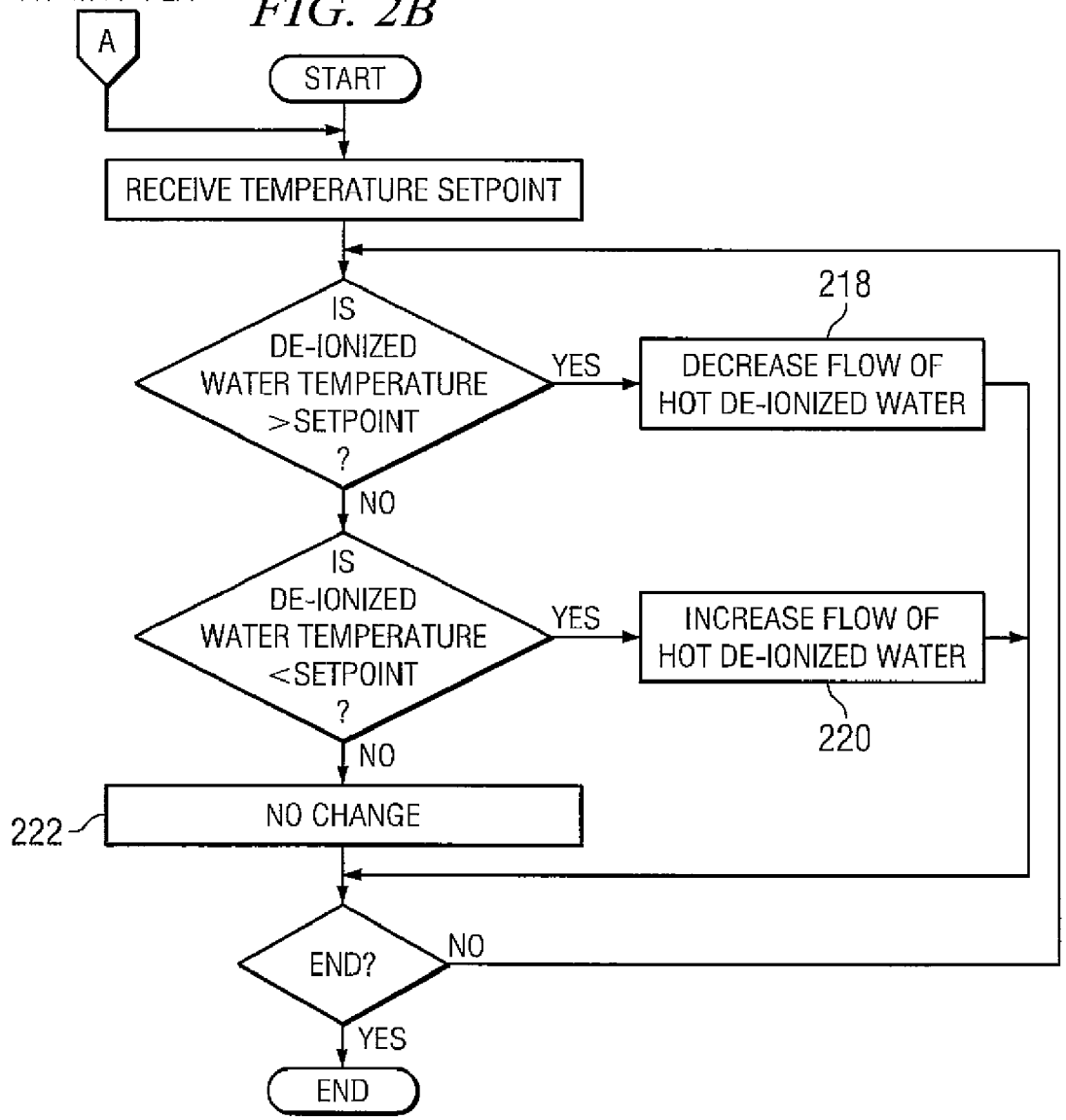

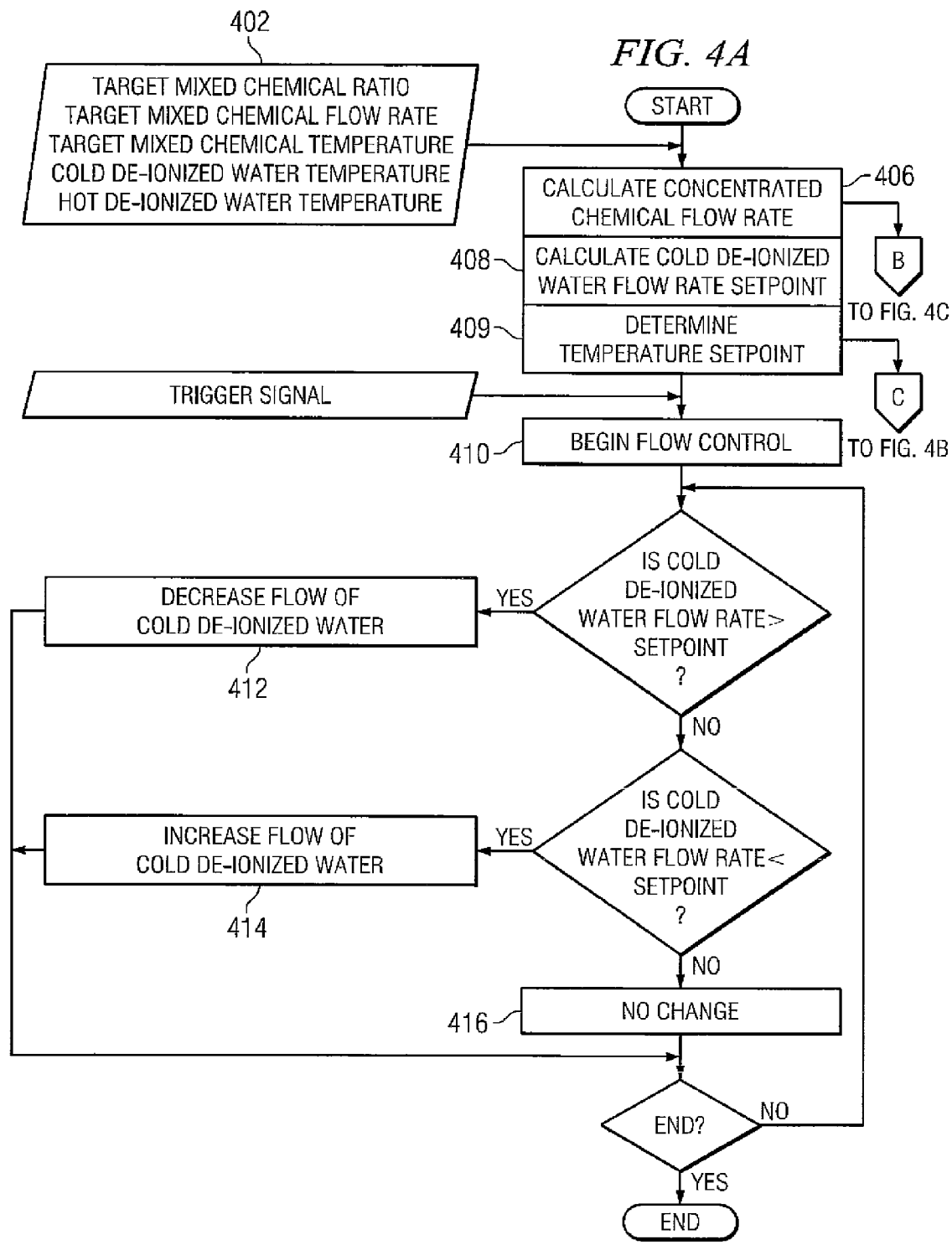

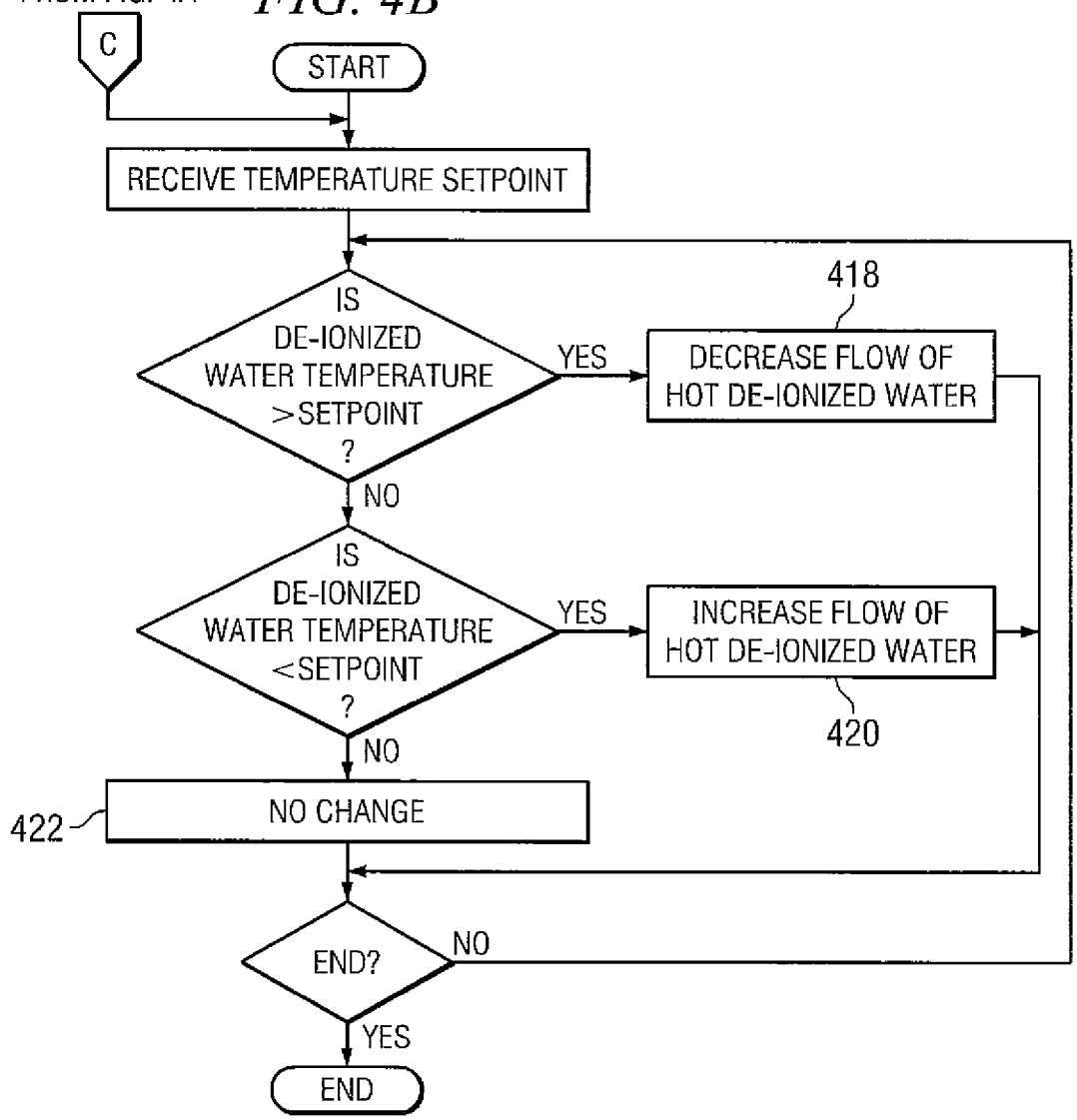

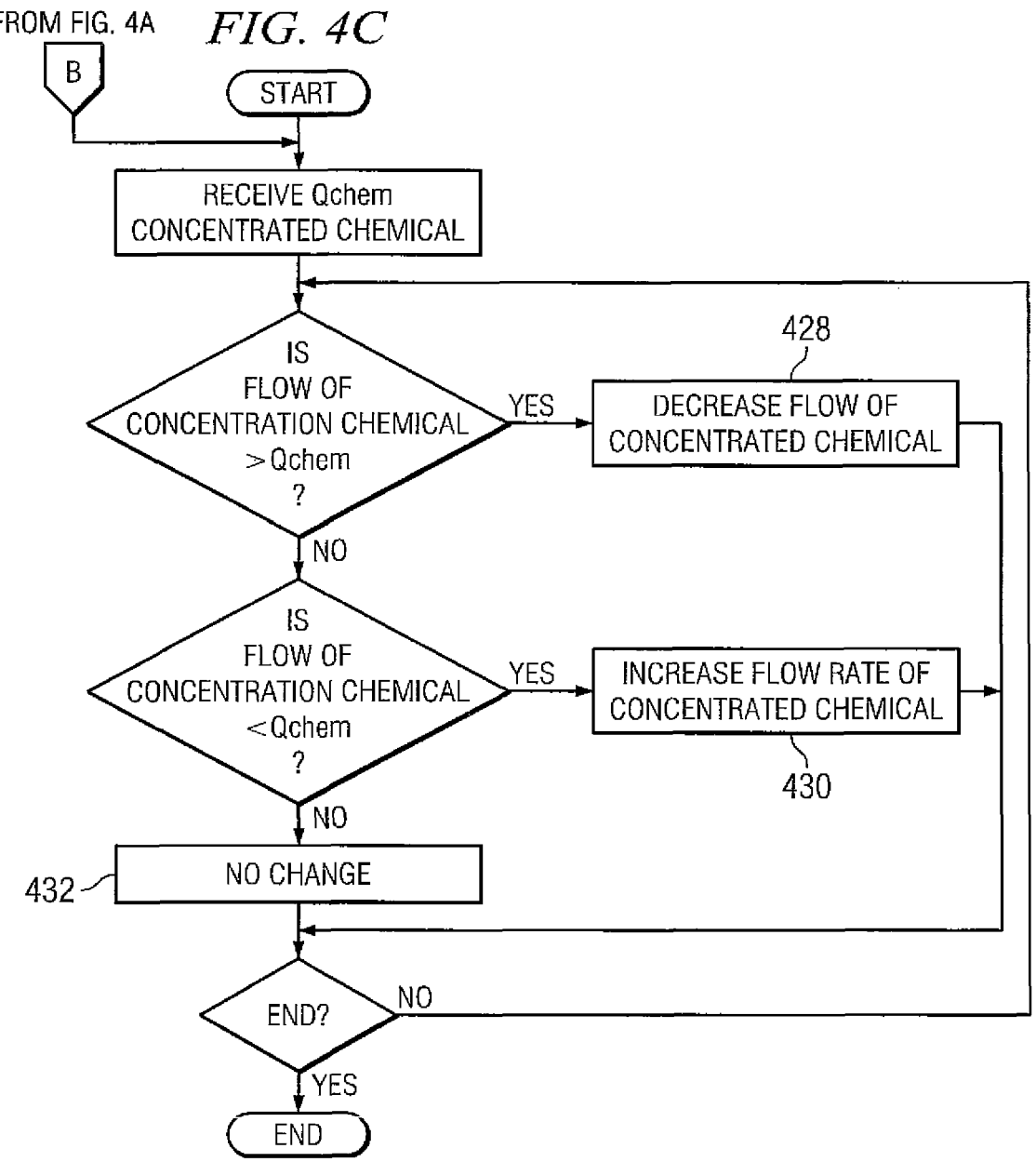

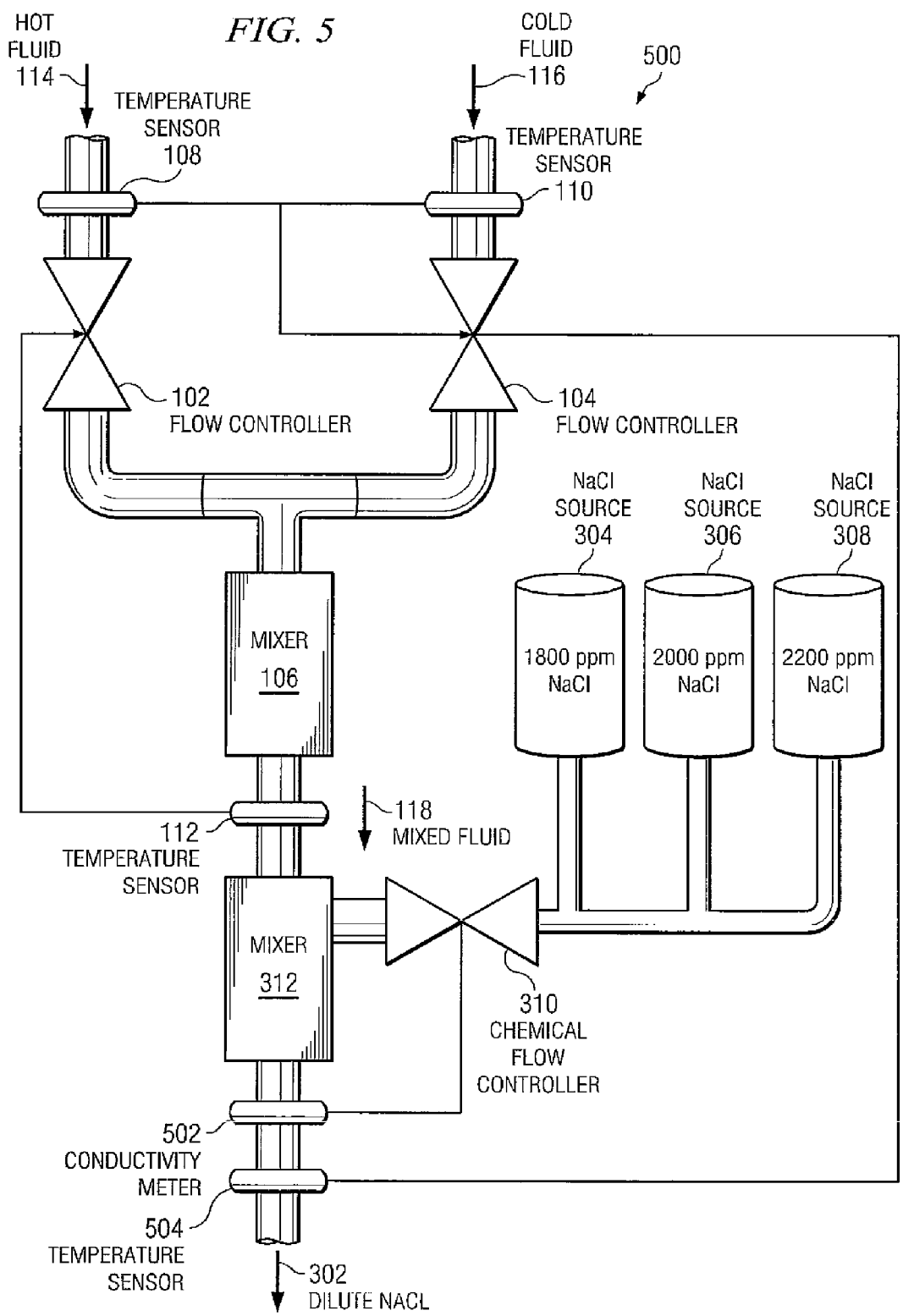

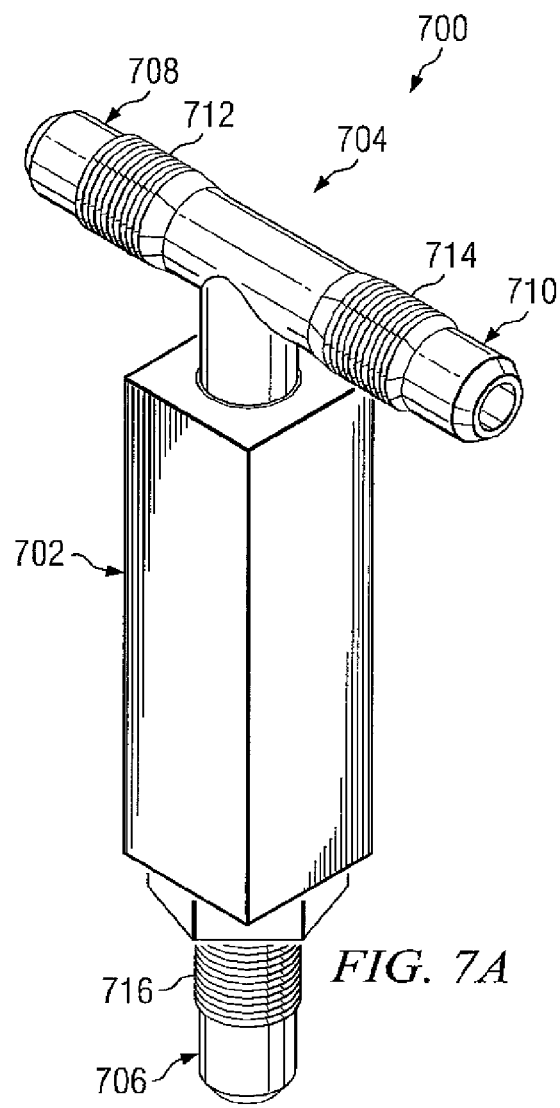
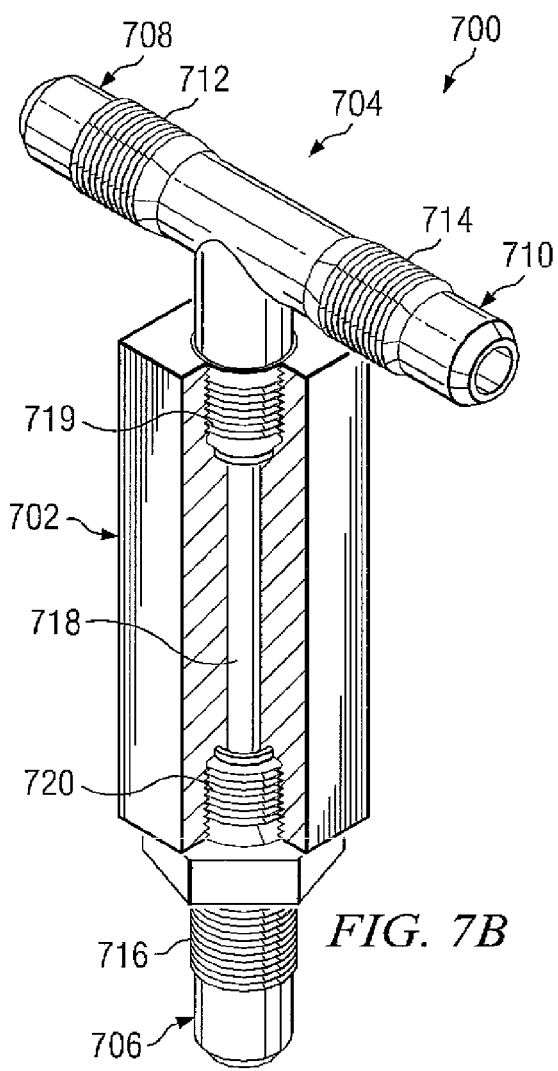

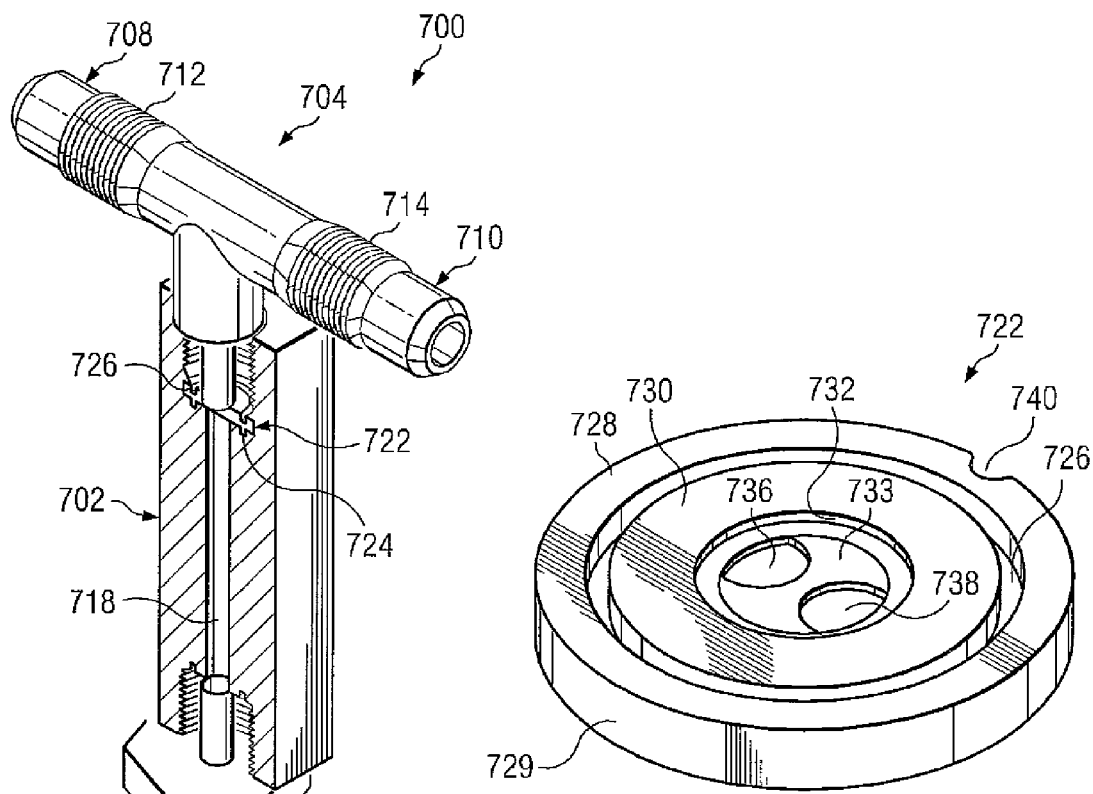
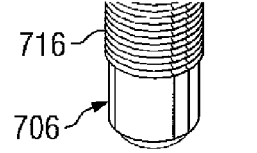
FIG. 7C
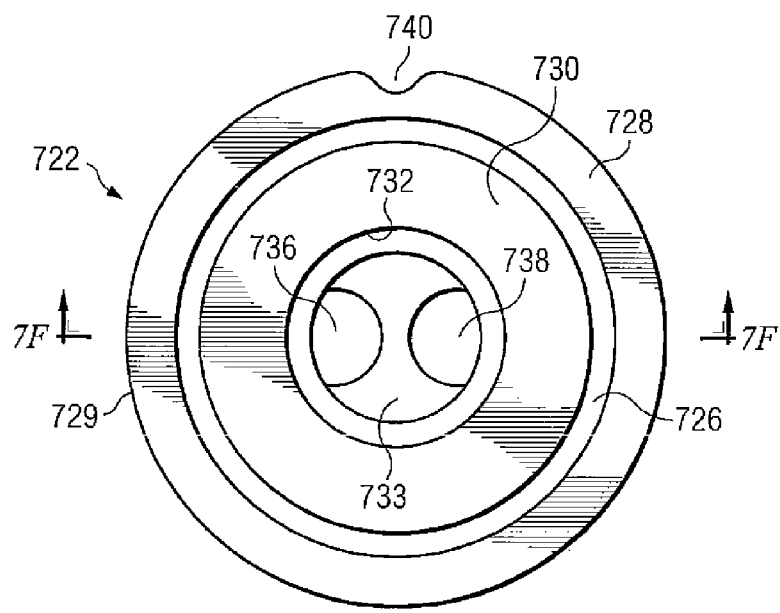
FIG. 7D
FIG. 7E

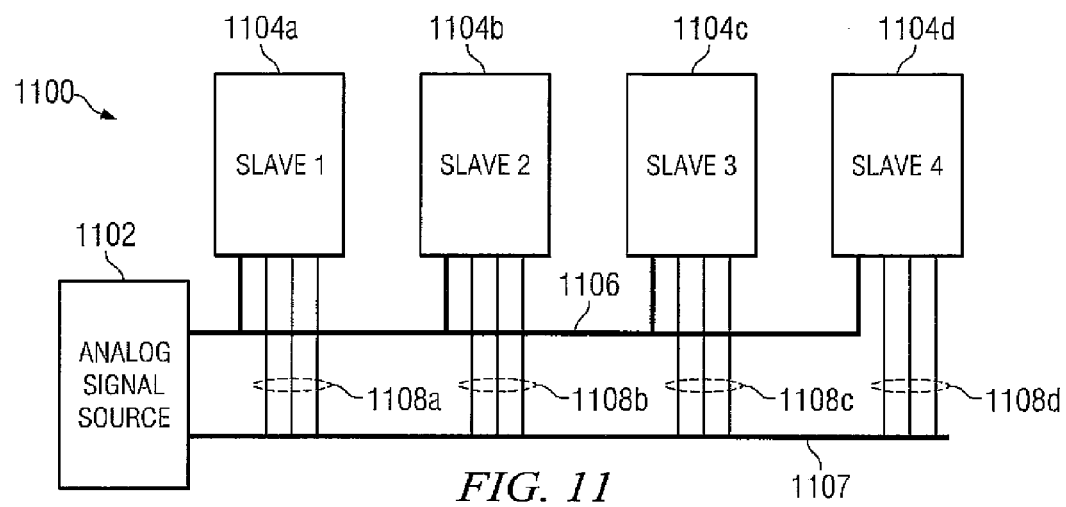
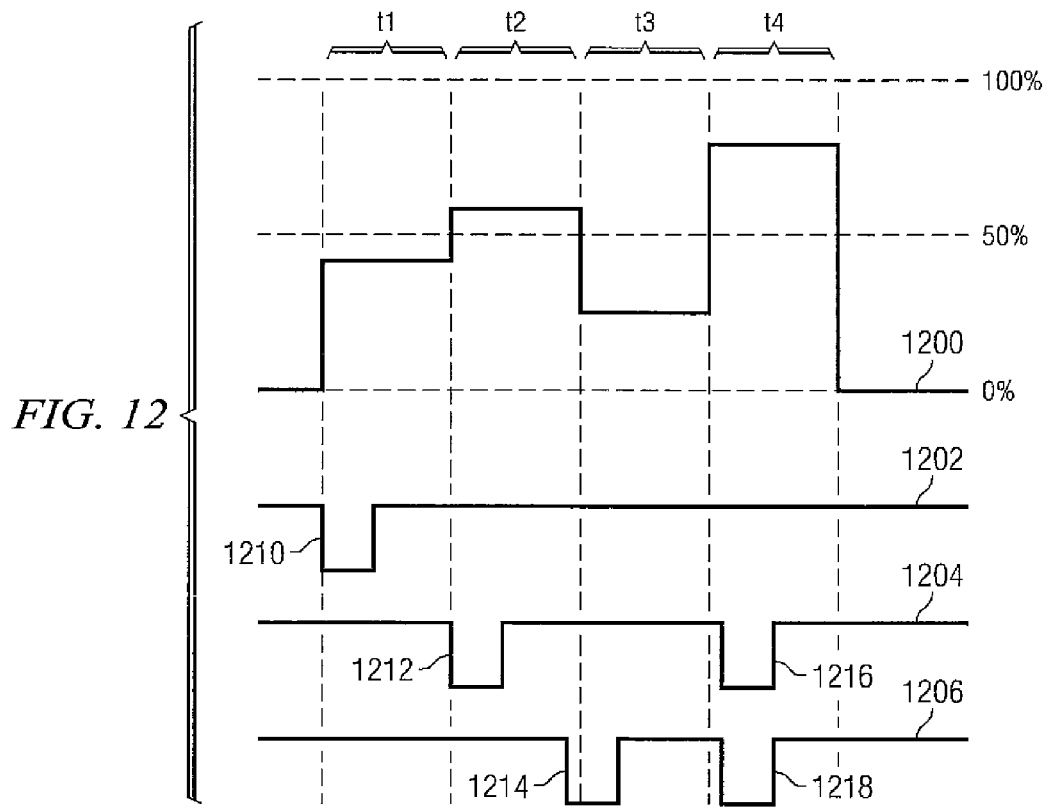

METHOD FOR CONTROLLED MIXING OF FLUIDS VIA TEMPERATURE

CROSS-REFERENCE TO RELATED APPLICATIONS

This application is a divisional of and claims priority under 35 U.S.C. §120 to U.S. patent application Ser. No. 11/386,427, now U.S. Pat. No. 7,494,265, entitled "SYSTEM FOR CONTROLLED MIXING OF FLUIDS VIA TEMPERATURE", by J. Karl Niermeyer et al., filed Mar. 22, 2006, which in turn is a divisional of and claims priority under 35 U.S.C. §120 to U.S. patent application Ser. No. 11/365,395, now U.S. Pat. No. 7,684,446, entitled "SYSTEM AND METHOD FOR MULTIPLEXING SETPOINTS", by McLoughlin, filed Mar. 1, 2006, all of which are hereby incorporated by reference.

TECHNICAL FIELD OF THE INVENTION

The present invention relates to chemical delivery systems. More particularly, embodiments of the present invention relate to systems and methods for the controlled mixing of fluids.

BACKGROUND

Controlled composition fluids are present in a number of widely used fluids including municipal water supplies, beverages, gasoline, intravenous ("IV") fluids and other useful fluids. In some cases, the controlled composition fluid is not the end product of a process, but is used in the manufacturing process of other products. For example, semiconductor manufacturing processes commonly use controlled composition fluids in cleaning and etching of semiconductor wafers.

Systems for creating controlled composition fluids typically mix a number of constituent fluids according to a proscribed ratiometric combination—in other words, a recipe. In some cases, it is not the stochiometric ratio of the fluid components that is important, but some property of the fluid mixture, such as pH, viscosity, ionic strength, conductivity or other property. Rather than controlling for the preferred property, however, it is often easier to blend the fluid components to a target concentration which corresponds to the actual target property.

Typically, fluids of a particular concentration are produced in a batch mode. In a batch process, the gravimetric or volumetric ratios of component fluids are used to determine how much of each fluid is added into a mix vessel for blending. While the use of batch process allows for fairly easy control of concentration, it limits production of the blended fluid to a particular size batch. To provide additional blended fluid, more batches of the fluid must be produced. Additionally, current batch process systems have large footprints, relatively high capital costs and a high level of complexity. Examples of batch systems include ChemFlow Systems, Inc. of Addison, Ill. batch system which blends gravity fed components volumetrically, and the MassFusion™ system by BOC Edwards.

In addition to batch processes, controlled composition fluids can also be produced using continuous flow systems that mix fluids as the fluids flow to the process chamber. These systems provide for continuous production of a fluid. Currently continuous flow systems do not provide adequate control to compensate for inaccurate or changing component fluid properties such as concentration or temperature.

SUMMARY OF THE INVENTION

Embodiments of the present invention provide a system and method of continuous mixing of fluids that eliminates, or at least substantially reduces, the shortcomings of prior art fluid mixing systems and methods. More particularly, embodiments of the present invention provide a system and method to provide a mixed fluid at a desired flow rate and temperature in a manner that can quickly adjust for changing process parameters.

One embodiment of the present invention includes a fluid mixing system comprising a first flow controller (e.g., a cold fluid flow controller) to control the flow of a first fluid, a second flow controller (e.g., a hot fluid flow controller) to control the flow a second fluid, a first mixer (e.g., a static mixer) in fluid communication with and downstream of the first flow controller and second flow controller to mix the first and second fluid to produce a first mixed fluid and a temperature sensor downstream of the first mixer to measure the temperature of the first mixed fluid. The first flow controller is configured to regulate the flow of the first fluid using a desired flow rate for the first fluid while the second flow controller is configured to regulate the flow of the second fluid based on a temperature setpoint and temperature of the first mixed fluid.

Another embodiment of the present invention includes a fluid mixing method comprising providing a first fluid and second fluid to a first mixer, mixing the first fluid and second fluid at the first mixer to create a first mixed fluid, measuring the temperature of the first mixed fluid, regulating the flow of the first fluid to the mixer based on a first fluid target flow rate and regulating the flow of the second fluid to the mixer based on the temperature of the first mixed fluid and a temperature setpoint.

Yet another embodiment of the present invention includes a fluid mixing system comprising a hot fluid flow controller to control the flow of a hot fluid, a cold fluid flow controller to control the flow of a cold fluid, a first static mixer downstream of the first hot fluid flow controller and the cold fluid flow controller to receive the hot fluid, receive the cold fluid and mix the hot and cold fluids to create a mixed fluid, a mixed fluid temperature sensor to determine the temperature of the mixed fluid, a chemical flow controller to control the flow of a chemical, a second static mixer downstream of the chemical flow controller and the first static mixer to mix the mixed fluid and the chemical to create a dilute chemical and a chemical temperature sensor to measure the temperature of the dilute chemical. According to one embodiment, the cold fluid flow controller controls the flow of the cold fluid based on a cold fluid target flow rate and communicates a temperature setpoint to the hot fluid flow controller. The hot fluid flow controller regulates the flow rate of the hot fluid based on the temperature setpoint and temperature of the mixed fluid. The temperature setpoint can be continually updated based on the temperature of the dilute chemical. The chemical flow controller controls the flow of the chemical based on a target chemical flow rate.

The present invention provides an advantage over prior art systems and methods of mixing fluids by providing the ability to adjust temperature, chemistry and flow rate on the fly, leading to increased throughput and process flexibility.

Embodiments of the present invention provide another advantage over prior art systems of mixing fluids by providing the ability to rapidly compensate for changes in component fluid properties such as concentration, temperature and other process parameters.

In addition, embodiments of the present invention provide another advantage over prior art systems by controlling a hot fluid using a temperature based flow controller, thereby reducing errors that high temperatures caused by higher temperatures in pressure based flow controllers.

BRIEF DESCRIPTION OF THE FIGURES

A more complete understanding of the present invention and the advantages thereof may be acquired by referring to the following description, taken in conjunction with the accompanying drawings in which like reference numbers indicate like features and wherein:

FIG. 1 is a diagrammatic representation of one embodiment of a system for mixing fluids;

FIGS. 2A and 2B provide flow charts illustrating one embodiment of a method for controlling flow of fluids to create a mixed fluid;

FIGS. 4A-4C provide flow charts illustrating one embodiment of another method for controlling flow of fluids to create a mixed chemical;

FIG. 5 is a diagrammatic representation of yet another embodiment of system for mixing fluids;

FIGS. 7A-7F provide diagrammatic representations of one embodiment of a static mixer assembly 700 and its components;

FIG. 11 is a diagrammatic representation of one embodiment of a system for multiplexing analog setpoints;

FIG. 12 is a diagrammatic representation of an analog setpoint signal and corresponding signals for asserting setpoint indicators.

DETAILED DESCRIPTION

Figure 3:
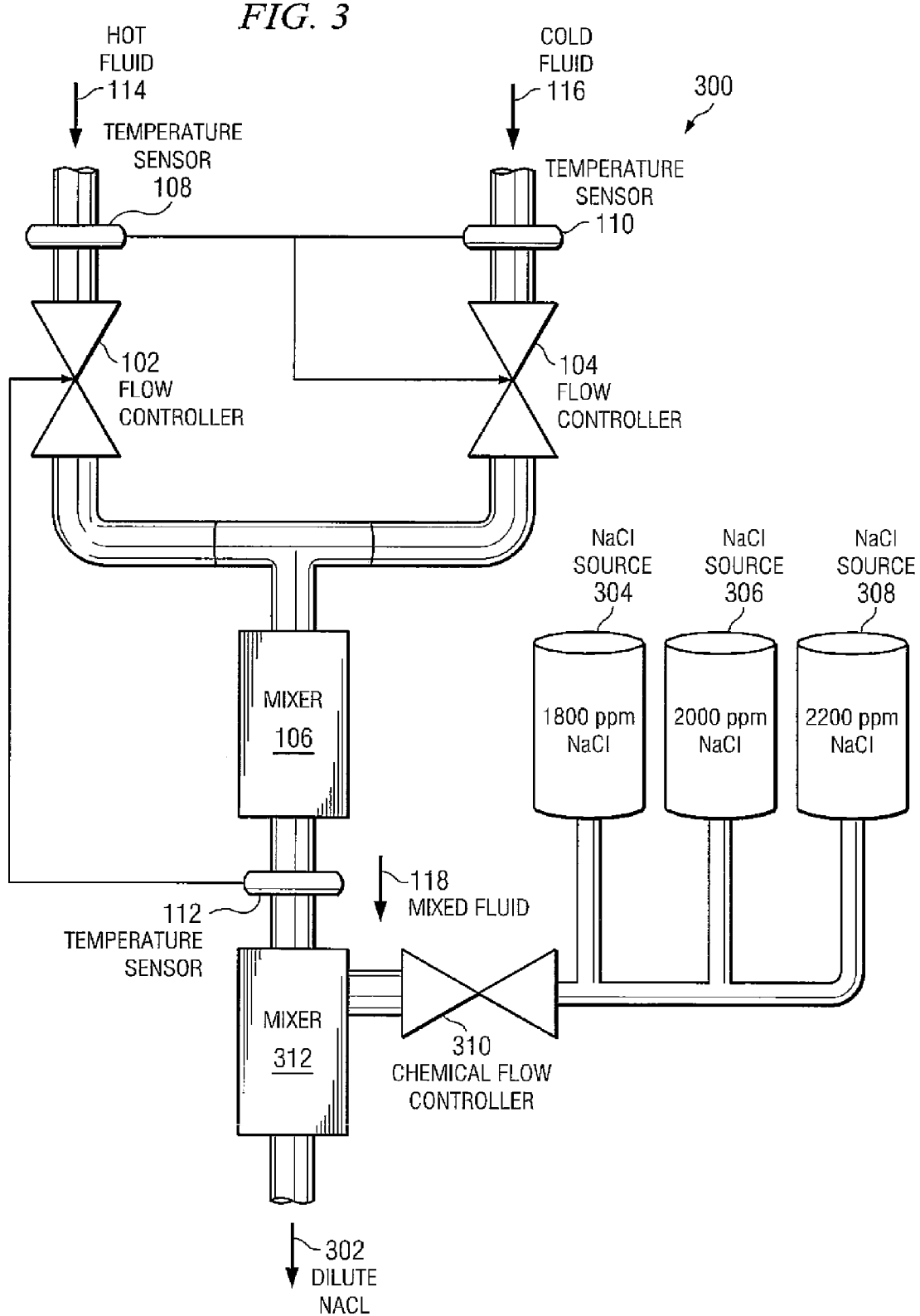
FIG. 3 is a diagrammatic representation of another embodiment of a system for mixing fluids.

Preferred embodiments of the invention are illustrated in the FIGURES, like numerals being used to refer to like and corresponding parts of the various drawings.

Embodiments of the present invention provide a system and method for continuous flow production of mixed fluids. The mixed fluids can comprise a mixture of different fluids or a mixture of the same fluid having different input properties such as temperature. In general, two streams of fluid of varying temperature are supplied to a mixer. The flow rate of each of the input fluids can be regulated to produce a mixed fluid at a desired flow rate and temperature. As an example, mass flow controllers can regulate the flow rates of a hot and cold stream of de-ionized water (D.I. $H_2O$ or DIW) to produce a stream of D.I. $H_2O$ at a desired flow rate and temperature.

The control algorithm of the mass flow controllers can rely on the fact that only one combination of mass flow rates of particular input fluids will produce a mixed fluid at the desired temperature and flow rate. Consequently, one of the mass flow controllers, acting as a master controller, can calculate the desired flow rate of fluid through it based on the temperatures of the input fluids, the specific heat(s) and densities of the input fluids, the target flow rate of the mixed fluid and the target temperature of the mixed fluid. The master controller can then pass the target temperature to a slave mass flow controller. The slave mass flow controller adjusts the flow rate of fluid through it based on the target temperature and the temperature of the mixed fluid as determined by a temperature sensor.

By using a temperature sensor to create a feedback loop to the slave mass flow controller, the slave mass flow controller can regulate fluid flow rate to quickly bring the mixed fluid to the desired temperature. As the temperature of the mixed fluid approaches the desired temperature, the flow rate of fluid through the slave mass flow controller is adjusted such that the flow rate of the mixed fluid approaches the desired flow rate. Thus, the mixed fluid will reach the desired temperature and flow rate.

FIG. 1 is a diagrammatic representation of one embodiment of a system 100 for mixing fluids. System 100 includes two flow controllers 102 and 104 that are in fluid communication with a mixer 106. System 100 further includes a temperature sensor 108 upstream of flow controller 102, a temperature sensor 110 upstream of flow controller 104 and a temperature sensor 112 downstream of mixer 106. Temperature sensor 108 and temperature sensor 110 are connected to (i.e., can communicate a signal representative of temperature) at least one of the flow controllers; flow controller 104 in this example. Temperature sensor 112 is also connected to at least one of the flow controllers. In this example, temperature sensor 112 is connected to flow controller 102.

According to one embodiment, flow controller 102 and flow controller 104 is each an OptiChem P1200 LFC flow controller produced by Mykrolis Corporation of Billerica, Mass. (now part of Entegris, Inc. of Chaska, Minn.), though other suitable flow controllers can be utilized. Mixer 106 can include any suitable dynamic or static mixer for mixing fluid flows. One embodiment of a static mixer is described in conjunction with FIGS. 7A-7F. The temperature sensors 108, 110 and 112 can include any suitable temperature sensors.

Fluid that is hotter than a target temperature (e.g., hot fluid 114) is supplied to flow controller 102 and a fluid that is colder than a target temperature (e.g., cold fluid 116) is supplied to flow controller 104. Flow controller 102 regulates the flow of hot fluid 114 and flow controller 104 regulates the flow of cold fluid 116 to mixer 106. These fluids are blended at mixer 106 to produce mixed fluid 118 at a desired temperature and flow rate.

The flow rates of hot fluid 114 and cold fluid 116 to mixer 106 can be controlled based on a target temperature (e.g., of mixed fluid 118), the temperatures of the hot and cold fluids, the fluid properties of the hot and cold fluids and the measured temperature of mixed fluid 118. More particularly, a process tool, control computer or other system can provide flow controller 104 a target temperature ($t_{T1}$) and flow rate ($Q_{T1}$) of mixed fluid 118. Additionally, temperature sensor 108 provides the temperature of hot fluid 114 ($t_H$) and temperature sensor 110 provides the temperature of cold fluid 116 ($t_C$). Flow controller 102 and flow controller 104 can also be provided with or preprogrammed with the type of hot and/or cold fluid used in system 100.

Based on the fluid type and temperatures of hot fluid 114 and cold fluid 116, flow controller 102 can calculate the densities ($\rho_H$, $\rho_C$) and specific heats ($Cp_H$, $Cp_C$) of hot fluid 114 and cold fluid 116. Flow controller 104 can similarly determine the density ($p_T$) and specific heat ($Cp_T$) of mixed fluid 118 at the target temperature ($t_T$). For example, if each of hot fluid 114 and cold fluid 116 is D.I. $H_2O$, the densities and specific heats can be calculated based on polynomials using the following coefficients:

TABLE 1

| Order | ρ = f(t) | Cp = f(t) |
| --- | --- | --- |
| 0 | .99988 | 1.00919 |
| 1 | 6.20242E−05 | −9.50319E−04 |
| 2 | −8.37727E−06 | 2.8655E−05 |
| 3 | 6.62195E−08 | −4.28993E−07 |
| 4 | −4.17404E−10 | 3.44932E−09 |
| 5 | 1.15955E−12 | −1.10643E−11 |

Table 1 is provided by way of example and not limitation. Other equations, lookup tables or other suitable mechanism can be used to determine the specific heat and density for hot fluid 114, cold fluid 116 and mixed fluid 118. Moreover, it should be understood that hot fluid 114 and cold fluid 116 can be different fluids.

Using the target flow rate ($Q_{T1}$), target temperature ($t_{T1}$), hot fluid temperature ($t_H$), cold fluid temperature ($t_C$), specific heats of the hot, cold and mixed fluids ($Cp_H$, $Cp_C$, $Cp_T$) and densities of the hot and cold fluids ($\rho_H$, $\rho_C$), controller 104, according to one embodiment, can calculate the target flow rate of cold fluid 116 ($Q_C$) to mixer 106 based, for example, on the following equation:

$$Q_C = Q_T * (1000/60) * (\rho_C/\rho_T) * (t_H * Cp_H - t_T Cp_T) / (t_H * Cp_H - t_C * Cp_C) \quad [\text{EQN. 1}]$$

$Q_T$=target flow rate (lpm)
$t_T$=target temperature (° C.)
$t_H$=hot fluid temperature (° C.)
$t_C$=cold fluid temperature (° C.)
$\rho_C$=cold fluid density (g/cm³)
$\rho_H$=hot fluid density (g/cm³)
$Cp_C$=cold fluid specific heat (cal/g*° C.)
$Cp_H$=hot fluid specific heat (cal/g*° C.)
$Cp_T$=mixed fluid specific heat at $t_T$ (cal/g*° C.)

Continuing with the previous example, $Q_T = Q_{T1}$ and $t_T = t_{T1}$, and flow controller 104 can determine the appropriate $Q_C$ according to any mechanism known or developed in the art. Flow controller 104 can regulate the flow of cold fluid 116 to the rate of $Q_C$ (within the tolerances of flow controller 104) using pressure differential based flow control, heat loss based flow control or other flow control scheme.

Flow controller 104 can further pass a temperature set point $t_{SP}$ to controller 102. The temperature set point, in this case, can indicate the desired temperature of mixed fluid 118. For example, $t_{SP}$ can be equal to $t_T$. Controller 102 compares the temperature of the mixed fluid ($t_{M1}$) to tsp. If $t_{M1} > $ than $t_{SP}$, controller 104 can decrease the flow of hot fluid 114 and if $t_{M1} < t_{SP}$, controller 104 can increase the flow of hot fluid 114. By adjusting the flow of hot fluid, $t_{M1}$ will approach $t_{SP}$. When $t_{M1}$ is approximately equal to $t_{SP}$, (i.e., within an acceptable deviation (e.g. 5%)), this indicates that mixed fluid 118 has reached the target flow rate and target temperature. In another embodiment, flow controller 104 receives $t_{M1}$ from temperature sensor 112 and passes $t_{M1}$ and $t_{SP}$ to flow controller 102.

Controller 104 can continually recalculate $Q_C$ and $t_{SP}$ (e.g., approximately at 1 Hz or above, according to one embodiment) as the input fluid temperatures, desired mixed fluid flow rate or other parameters change. Thus, the present invention can quickly adjust to changing process parameters.

As described above, controller 104 and controller 102 act in a master-slave fashion with controller 104 providing $t_{SP}$ to controller 102. The master-slave dynamic of these controllers can be reversed with controller 102 processing the inputs providing a $t_{SP}$ to controller 104. Furthermore, one of the controllers can be provided with the target temperature and flow rate and the other controller can be provided with $t_{SP}$ from an outside computer system or tool. In this case, neither controller 102 nor controller 104 acts as a master or slave with respect to the other controller.

It should be noted that higher temperature fluids can cause errors in pressure based controllers. If a pressure based flow controller is used to control the hot DIW, significant errors may be encountered as commonly used pressure sensors are typically sensitive to temperature changes. If the hot fluid flow controller controls flow based on pressure, temperature compensation circuitry can be used. Or, as in the embodiments described above, the hot fluid flow controller can employ a temperature based control scheme.

FIGS. 2A and 2B provide flow charts illustrating one embodiment of a method for controlling flow of fluids to create a mixed fluid. The method of FIGS. 2A and 2B can be implemented as computer instructions that are executable by a processor stored on a computer readable medium. For example, embodiments of the present invention can be implemented through programming of one or more OptiChem P1200 LFC flow controllers.

The flow chart of FIG. 2A corresponds to the control method implemented at the cold fluid flow controller (e.g., flow controller 104 of FIG. 1) and FIG. 2B corresponds to the method implemented at the hot fluid flow controller (e.g., flow controller 102 of FIG. 1).

The cold fluid flow controller receives inputs including the target mixed fluid temperature ($t_{T1}$), the target mixed fluid flow rate ($Q_{T1}$), the cold fluid temperature ($t_C$), the hot fluid temperature ($t_H$) (step 202). Using these inputs and the properties such as specific heat and density of the cold fluid, hot fluid and mixed fluid (at the target temperature), the cold fluid flow controller calculates the cold fluid flow rate ($Q_C$) according to EQN. 1, where $Q_T = Q_{T1}$ and $t_T = t_{T1}$ (step 204). The cold fluid flow controller sets a temperature set point $t_{SP}$ for the hot fluid flow controller (step 206). For example, $t_{SP}$ can be calculated or set to $t_{T1}$.

When a trigger signal is received (step 208), the cold fluid flow controller can begin regulating fluid flow using $Q_C$ as a flow rate set point and issue commands to the hot fluid flow controller to regulate flow of the hot fluid (step 210). The cold fluid flow controller can adjust the flow of cold fluid according to fluid flow control schemes known in the art, including but not limited to differential control schemes, integral control schemes, proportional integral control schemes, fuzzy logic or proportional integral differential control schemes. If the fluid flow of cold water is greater than the fluid flow set point, cold fluid flow controller can decrease the flow rate (step 212), if the fluid flow of cold water is less than the fluid flow set point, the cold fluid flow controller can increase the flow rate, and if the cold fluid flow rate equals the set point (within an acceptable system tolerance) (step 214), the cold fluid flow controller can maintain the flow rate (step 216). Thus, the cold fluid flow controller can adjust the flow rate of cold fluid based on the target cold fluid flow rate set point $Q_C$.

Turning to FIG. 2B, the hot fluid flow controller, on the other hand, can adjust the flow rate of the hot fluid based on the temperature of the mixed fluid ($t_{M1}$) and the mixed fluid set point ($t_{SP}$). The temperature of the mixed fluid can be received either directly from a temperature sensor or from the cold fluid flow controller. If $t_{M1}$ is greater than $t_{SP}$, the hot fluid flow controller decreases the flow rate of fluid (step 218), if $t_{M1}$ is less than $t_{SP}$, the hot fluid flow controller increases the flow rate of the hot fluid (step 220) and if $t_{M1}$ is equal to $t_{SP}$ (within acceptable system tolerances), the hot fluid flow controller maintains the flow rate of hot fluid (step 222).

The steps of FIGS. 2A and 2B can be repeated as needed or desired. Moreover, the various steps can be performed in a variety of orders and various steps performed by each flow controller can be performed in parallel.

While, in the embodiment of FIGS. 2A and 2B, the cold water flow controller is responsible for determining the set point $t_{SP}$ for the hot water flow controller, in other embodiments, the hot water flow controller can determine $t_{SP}$ for itself or provide $t_{SP}$ to the cold water flow controller so that the cold water flow controller can regulate flow based on $t_M$. In other words, the roles of the hot and cold water flow controllers can be reversed and the steps of FIG. 2 can be otherwise distributed between the controllers.

Thus, one embodiment of the present invention can include a first flow controller (e.g. flow controller 104), a second flow controller (e.g. flow controller 102) and a mixer downstream of the first and second flow controllers. The first flow controller can regulate the flow of a first fluid based on a target flow rate for the first fluid (e.g., $Q_C$), and the second flow controller can regulate the flow of a second fluid based on a temperature set point and a temperature of the mixed fluid created by the mixer.

The system of FIG. 1 can be implemented as a subsystem of a larger mixing system that combines the mixed fluid with additional fluids, such as other chemicals. FIG. 3 illustrates a solution mixing system 300 that incorporates the subsystem of FIG. 1. In the example of FIG. 3, solution mixing system 300 provides a concentrated NaCl solution mixing system in which the mixed DIW 118 is combined with NaCl to produce dilute NaCl 302. In addition to the components discussed in conjunction with FIG. 1, solution mixing system 300 includes one or more sources of concentrated NaCl (here illustrated as 1800 parts per million (ppm) NaCl source 304, 2000 ppm source 306 and 2200 ppm source 308). A chemical flow controller 310 controls the flow of concentrated NaCl to a second mixer 312 where the concentrated chemical is mixed with mixed DIW 118. Mixer 312, according to one embodiment of the present invention can be a static mixer.

For the sake of example, cold fluid flow controller 104 can act as a master controller for hot fluid flow controller 102 and chemical flow controller 310. Cold fluid flow controller 104 receives a target mixed chemical flow rate ($Q_{T2}$) for dilute NaCl 302, a target mixed chemical ratio for dilute NaCl, a target mixed chemical temperature ($t_{T2}$) for dilute NaCl 302, $t_C$, and $t_H$. Based on the target mixed chemical flow rate $Q_{T2}$ and the target mixed chemical ratio, cold fluid controller 104 can determine the target flow rate of DIW ($Q_{T1}$) and flow rate of concentrated NaCl ($Q_{chem}$). Assuming that the temperature of the concentrated chemical has a negligible effect on the temperature of dilute NaCl 302, the target temperature of mixed DIW 118 can be set equal to $t_{T2}$ (i.e., $t_{T1}=t_{T2}$). Using $t_{T2}$, $Q_{T1}$ and the input temperatures of the hot and cold DIW, cold fluid flow controller 104 can further determine the target cold DIW flow rate ($Q_C$) and temperature set point $t_{SP}$ for hot fluid flow controller 104. Cold fluid flow controller 104 provides $t_{SP}$ to hot fluid flow controller 102 and $Q_{chem}$ to chemical flow controller 310. Each flow controller can then control the flow of its respective fluid.

FIGS. 4A-4C are flow charts illustrating one embodiment of a method for controlling flow of fluids to create a mixed fluid. The method of FIGS. 4A-4C can be implemented as computer instructions that are executable by a processor stored on a computer readable medium. For example, embodiments of the present invention can be implemented through programming of one or more Optichem P1200 LFC flow controllers.

FIG. 4A corresponds to the control method implemented at the cold fluid flow controller (e.g., flow controller 104 of FIG. 3), FIG. 4B corresponds to the control method implemented at the hot fluid flow controller (e.g., flow controller 102 of FIG. 3) and FIG. 4C to the control method implemented at chemical flow controller 310.

The cold fluid flow controller receives inputs including the target mixed chemical mix ratio, the target mixed chemical flow rate ($Q_{T2}$), the cold fluid temperature ($t_C$), the hot fluid temperature ($t_H$), the target mixed chemical temperature ($t_{T2}$) (step 402). Using the target mixed chemical mix ratio and the target mixed chemical flow rate $Q_{T2}$, the cold fluid flow controller can determine the target DIW flow rate $Q_{T1}$ and the flow rate of the concentrated chemical or other fluid ($Q_{chem}$) (e.g., NaCl in the example of FIG. 3) (step 406). Assuming that the flow of NaCl will have little effect on the overall temperature of the mixed chemical, the cold fluid flow controller can set the target mixed DIW temperature ($t_{T1}$) equal to the target mixed chemical temperature ($t_{T2}$) and determine $Q_C$ according to EQN 1, where $Q_T=Q_{T1}$ (step 408). Additionally, the cold fluid flow controller can set $t_{SP}=t_{T1}-t_{T2}$ (also shown at 409).

When a trigger signal is received (step 410), the cold fluid flow controller can begin regulating fluid flow using $Q_C$ as a flow rate set point, issue commands to the hot fluid flow controller to regulate flow of the hot fluid and issue commands to the chemical flow controller to control flow of the third fluid. The cold fluid flow controller can for adjust the flow of cold fluid according to fluid flow control schemes known in the art, including but not limited to differential control schemes, integral control schemes, proportional integral control schemes, fuzzy logic or proportional integral differential control schemes. If the fluid flow of cold water is greater than the fluid flow set point, cold fluid flow controller can decrease the flow rate (step 412), if the fluid flow of cold water is less than the fluid flow set point (step 414), the cold fluid flow controller can increase the flow rate, and if the cold fluid flow rate equals the set point (within an acceptable system tolerance), the cold fluid flow controller can maintain the flow rate (step 416). Thus, the cold fluid flow controller can adjust the flow rate of cold fluid based on the cold fluid flow rate set point $Q_C$.

As shown in FIG. 4B, the hot fluid flow controller can adjust the flow rate of the hot fluid based on the temperature of the mixed fluid ($t_{M1}$) and the mixed fluid set point ($t_{SP}$). The temperature of the mixed fluid can be received either directly from a temperature sensor or from the cold fluid flow controller. If $t_{M1}$ is greater than $t_{SP}$, the hot fluid flow controller decreases the flow rate of fluid (step 418), if $t_{M1}$ is less than $t_{SP}$, the hot fluid flow controller increases the flow rate of the hot fluid (step 420) and if $t_{M1}$ is equal to $t_{SP}$ (within acceptable system tolerances), the hot fluid flow controller maintains the flow rate of hot fluid (step 422).

The chemical flow controller can similarly adjust the flow of the additional fluid (e.g., concentrated NaCl) based on $Q_{chem}$ as is shown in FIG. 4C. If the fluid flow of the concentrated chemical (or other fluid) is greater than the $Q_{chem}$, chemical flow controller can decrease the flow rate (step 428), if the fluid flow of the concentrated chemical is less than $Q_{chem}$ (step 430), the cold fluid flow controller can increase the flow rate, and if the concentrated chemical flow rate equals the set point (within an acceptable system tolerance), the chemical flow controller can maintain the flow rate (step 434). Thus, the chemical flow controller can adjust the flow rate of concentrated chemical based on the cold fluid flow rate set point $Q_{chem}$.

The flow charts of FIGS. 4A-4C represent one example embodiment of the present invention. However, it should be understood, that the steps of FIGS. 4A-4C can be repeated as needed or desired and can be performed in different orders.

Moreover, the steps implemented at each flow controller can be performed in parallel. While, in FIGS. 4A-4C, the cold water flow controller is responsible for calculating various parameters and asserting set points to the hot water flow controller and chemical flow controller, the step of FIGS. 4A-4C can be otherwise distributed to the flow controllers. Additionally, the roles of the hot water and cold water flow controllers can be reversed such that the hot water flow controller controls flow based on a flow rate set point and the cold water flow controller controls flow based on a temperature set point.

In the embodiment of FIGS. 3 and 4A-4C, it is assumed that $t_{T2}$ is not greatly affected by the temperature of the additional fluid added at the second mixer 312. Thus, it is assumed that the temperature of fluid at the outlet of mixer 312 ($t_{M2}$) is approximately $t_{M1}$ (i.e., is approximately the temperature of the mixed DIW). According to another embodiment of the present invention, an additional temperature sensor can be used to measure $t_{M2}$ so that this temperature can be used in flow control.

FIG. 5 is a diagrammatic representation of one embodiment of a solution mixing system 500 similar to that of FIG. 3 that adds a conductivity meter 502 and an additional temperature sensor 504 downstream of second mixer 312. Because the conductivity of a fluid is typically related to the concentration of a fluid, the feedback from conductivity sensor 502 can be used to adjust the concentration of concentrated chemical added at static mixer 312 to achieve a desired conductivity. Additionally, the temperature read by temperature sensor 504 can be used to adjust the flow rates of the hot and cold DIW.

For the sake of example, cold fluid flow controller 104 can act as a master controller for hot fluid flow controller 102 and chemical flow controller 310. Initially, cold fluid flow controller 104 receives a target mixed chemical flow rate ($Q_{T2}$), a target mixed chemical ratio, a target mixed chemical temperature ($t_{T2}$), $t_C$, and $t_H$. Based on the target mixed chemical flow rate $Q_{T2}$ and the target mixed chemical ratio, cold fluid controller 104 can determine the target flow rate of DIW ($Q_{T1}$) and flow rate of concentrated NaCl ($Q_{chem}$). Initially, $t_{T1}$ can be set equal to $t_{T2}$. Using $Q_{T1}$, $t_{T2}$, and the input temperatures of the hot and cold DIW, cold fluid flow controller 104 can further determine the target cold DIW flow rate ($Q_C$) and temperature set point $t_{SP}$ for hot fluid flow controller 104. $t_{SP}$ can also initially be set equal to $t_{T2}$. Cold fluid flow controller 104 provides $t_{SP}$ to hot fluid flow controller 102 and $Q_{chem}$ to chemical flow controller 310. Each flow controller can then control the flow of its respective fluid.

According to one embodiment, controller 104 can use the temperature of the dilute chemical ($t_{M2}$) to adjust the flow rates of hot and cold DIW. Although control using $t_{M2}$ can begin immediately, according to other embodiments, cold fluid flow controller 104 can wait a predefined period of time before beginning control using $t_{M2}$. This can be done, for example, to allow the flow and temperature of the dilute chemical to settle.

Cold fluid flow controller 104, according to one embodiment, can adjust $Q_C$ and $t_{SP}$ based on the measured temperature of the mixed chemical ($t_{M2}$). For example, given $t_{M2}$ from temperature sensor 504, cold fluid flow controller 104 can set the new $t_{SP}$ equal to:

$$t_{SP(n)} = t_{SP(n-1)} + (t_{T2} - t_{M2})$$ [EQN. 2]

Thus, if $t_{M2}$ is greater than $t_{T2}$, the $t_{SP}$ is lowered, leading to a decrease in the temperature of DIW, and if $t_{M2}$ is less than $t_{T2}$, $t_{SP}$ is raised, leading to an increase in the temperature of DIW. Cold fluid flow controller 104 can further determine a new target flow rate for the cold DIW (i.e., a new $Q_C$) using the $t_{SP}$ calculated in EQN 2 for $t_T$ of EQN 1. As described above, cold fluid flow controller 104 can regulate flow according to $Q_C$ and hot fluid flow controller 102 can regulate flow according to $t_{SP}$ and $t_{M1}$.

Figure 6A:
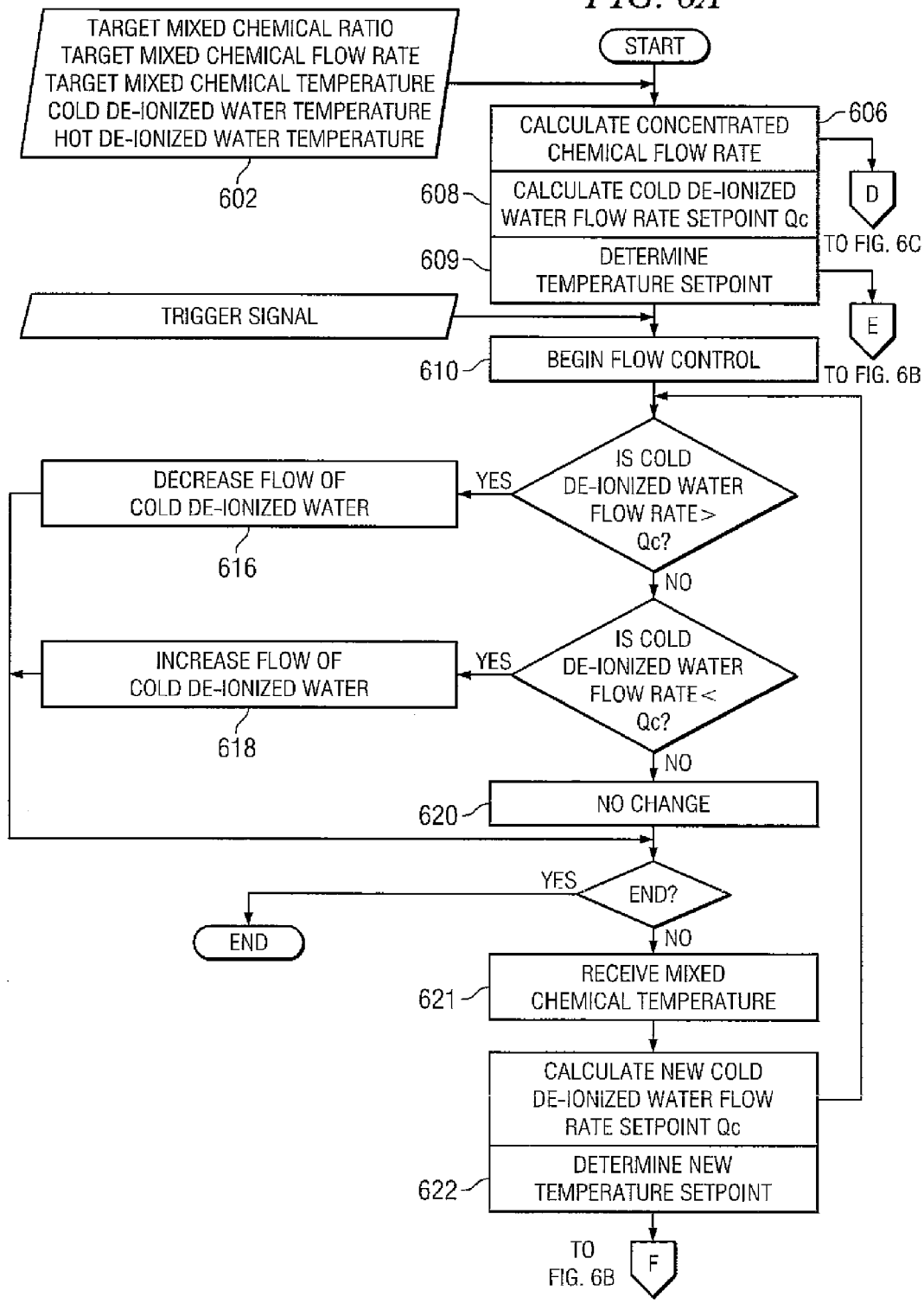
FIGS. 6A-6C provide flow charts illustrating another embodiment of another method for controlling flow of fluids to create a mixed chemical.
Figure 6B:
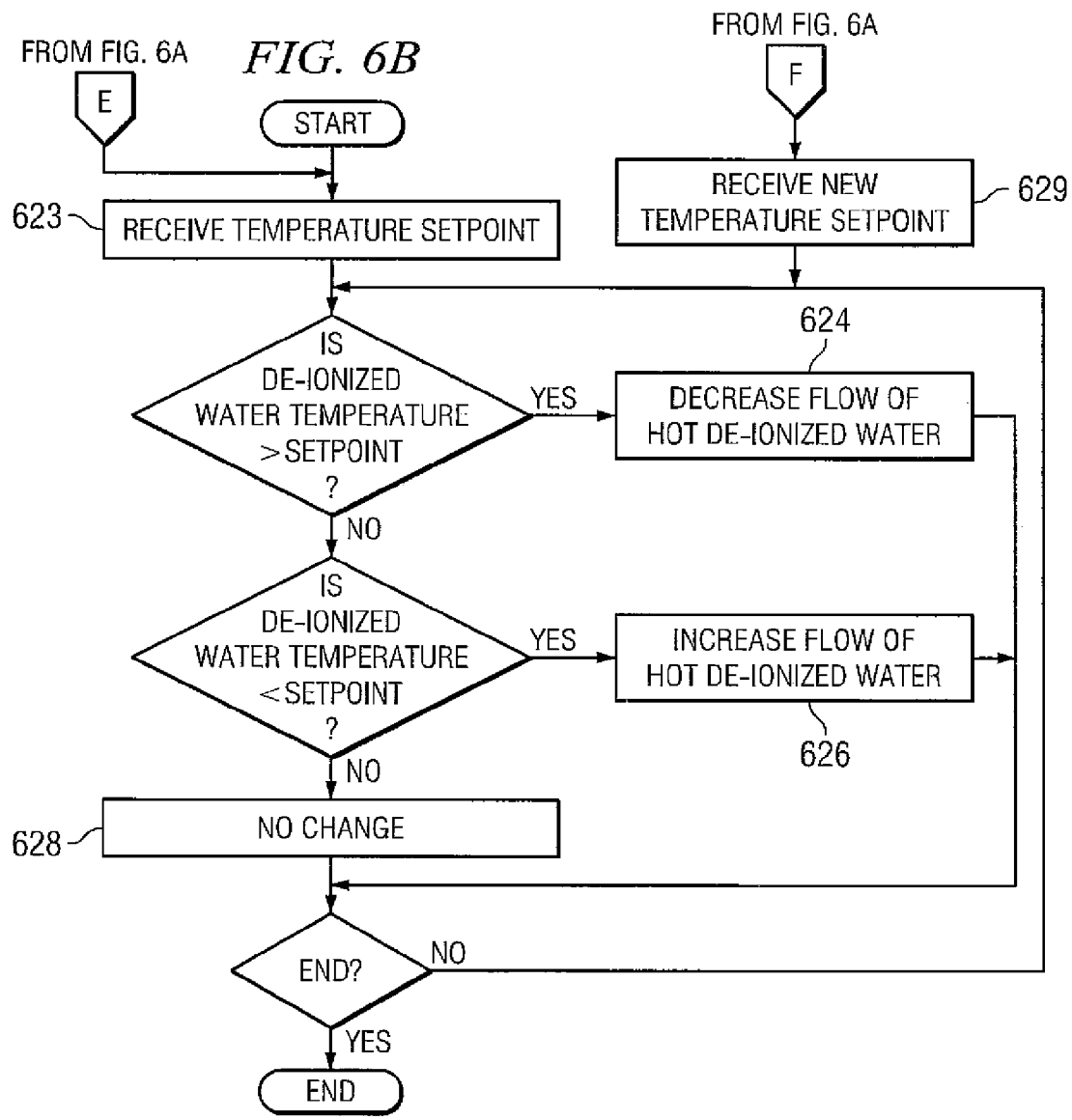
Figure 6C:
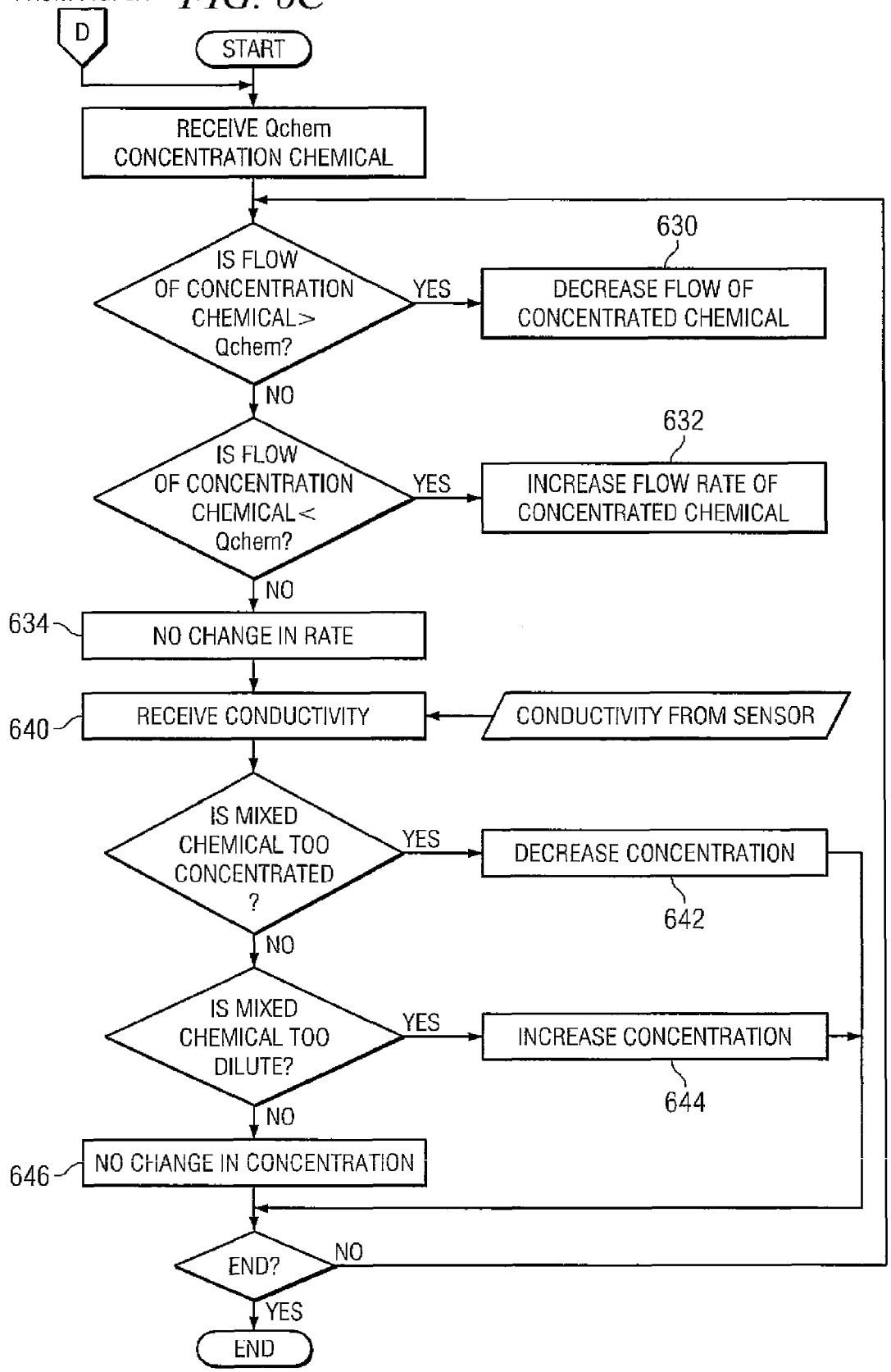

FIGS. 6A-6C are flow charts illustrating one embodiment of a method for controlling flow of fluids to create a mixed fluid. The method of FIGS. 6A-6C can be implemented as computer instructions that are executable by a processor stored on a computer readable medium. For example, embodiments of the present invention can be implemented through programming of one or more OptiChem P1200 LFC flow controllers.

FIG. 6A corresponds to the control method implemented at the cold fluid flow controller (e.g. r flow controller 104 of FIG. 5), FIG. 6B corresponds to the control method implemented at the hot fluid flow controller (e.g., flow controller 102 of FIG. 5) and FIG. 6C corresponds to the control method implemented at chemical flow controller 310.

The cold fluid flow controller receives inputs including target mixed chemical mix ratio, the target mixed chemical flow rate ($Q_{T2}$), the cold fluid temperature ($t_C$) the hot fluid temperature ($t_H$), the target mixed chemical temperature ($t_{T2}$) (step 602). Using the target mixed chemical mix ratio and the target mixed chemical flow rate $Q_{T2}$, the cold fluid flow controller can determine the target DIW flow rate $Q_{T1}$ and the flow rate of the concentrated chemical or other fluid ($Q_{chem}$) (e.g., NaCl in the example of FIG. 5) (step 606). Flow controller 102 can initially act as if the flow of NaCl will have little effect on the temperature of $t_{T2}$. Therefore, the cold fluid flow controller can set $t_T=t_{T2}$ and determine $Q_C$ according to EQN 1, where $Q_T=Q_{T1}$ and $t_T=t_{T2}$ (step 608). Additionally, the cold fluid flow controller can set $t_{SP}=t_T$ (also shown at 609).

When a trigger signal is received (step 610), the cold fluid flow controller can begin regulating fluid flow using $Q_C$ as a flow rate set point, issue commands the hot fluid flow controller to regulate flow of the hot fluid and issue commands to the chemical flow controller to control flow of the third fluid. The cold fluid flow controller can for adjust the flow of cold fluid according to fluid flow control schemes known in the art, including but not limited to differential control schemes, integral control schemes, proportional integral control schemes, proportional integral differential, or fuzzy logic control schemes. If the fluid flow of cold water is greater than the fluid flow set point, cold fluid flow controller can decrease the flow rate (step 616), if the fluid flow of cold water is less than the fluid flow set point (step 618), the cold fluid flow controller can increase the flow rate, and if the cold fluid flow rate equals the set point (within an acceptable system tolerance), the cold fluid flow controller can maintain the flow rate (step 620). Thus, the cold fluid flow controller can adjust the flow rate of cold fluid based on the cold fluid flow rate set point $Q_C$.

The cold fluid flow controller can also receive the temperature of the mixed chemical from a temperature sensor downstream of the second mixer (e.g., can receive $t_{M2}$ from temperature sensor 504 of FIG. 5) (step 622). Using $t_{M2}$, the cold fluid flow controller can calculate a new $Q_C$ and $t_{M2}$ as, for example, described in conjunction with FIG. 5 (step 638). Cold fluid flow controller can then perform steps 618-620 using the new $Q_C$ and pass the new $t_{SP}$ to the hot fluid flow controller. According to one embodiment, $Q_C$ and $t_{SP}$ can be continually updated as $t_{M2}$ changes.

As shown in FIG. 6B the hot fluid flow controller, can adjust the flow rate of the hot fluid based on the temperature of the mixed fluid ($t_{M1}$) and the mixed fluid set point ($t_{SP}$). The temperature of the mixed fluid can be received either directly from a temperature sensor or from the cold fluid flow controller. Hot water flow controller 104 receives the initial temperature set point $t_{SP}$ (step 623). If $t_{M1}$ is greater than $t_{SP}$, the hot fluid flow controller decreases the flow rate of fluid (step 624), if $t_{M1}$ is less than $t_{SP}$, the hot fluid flow controller increases the flow rate of the hot fluid (step 626) and if $t_{M1}$ is equal to $t_{SP}$ (within acceptable system tolerances), the hot fluid flow controller maintains the flow rate of hot fluid (step 628). The hot fluid flow controller can receive the new temperature set point at step 629 and perform steps 624-628 accordingly.

The chemical flow controller can similarly adjust the flow of the additional fluid (e.g., concentrated NaCl) based on $Q_{chem}$. If the fluid flow of the concentrated chemical (or other fluid) is greater than the $Q_{chem}$, chemical flow controller can decrease the flow rate (step 630), if the fluid flow of the concentrated chemical is less than $Q_{chem}$ (step 632), the cold fluid flow controller can increase the flow rate, and if the concentrated chemical flow rate equals the set point (within an acceptable system tolerance), the chemical flow controller can maintain the flow rate (step 634). Thus, the chemical flow controller can adjust the flow rate of concentrated chemical based on the cold fluid flow rate set point $Q_{chem}$.

Additionally, the chemical flow controller can receive a measurement of conductivity of the mixed chemical (step 640). Using the conductivity, the flow controller can adjust the concentration of chemical added at the second mixer. If the conductivity indicates that the mixed chemical is too concentrated, the flow controller can decrease the concentration of concentrated chemical (step 642). If the conductivity sensor indicates that the mixed chemical is too dilute, the flow controller can increase the concentration of the concentrated chemical added to the DIW. Otherwise, the concentration can be unchanged (step 646).

The flow charts of FIGS. 6A-6C represent one example embodiment of the present invention. However, it should be understood, that the steps of FIGS. 6A-6C can be repeated as needed or desired and can be performed in different orders. Moreover, the steps implemented at each flow controller can be performed in parallel. While, in FIGS. 6A-6C, the cold water flow controller is responsible for calculating various parameters and asserting set points to the hot water flow controller and chemical flow controller, the steps of FIGS. 6A-6C can be otherwise distributed to the flow controllers. Additionally, the roles of the hot water and cold water flow controllers can be reversed such that the hot water flow controller controls flow based on a flow rate set point and the cold water flow controller controls flow based on a temperature set point.

Figure 7F:
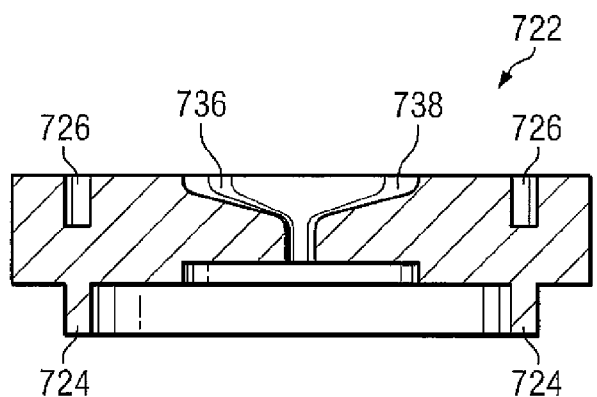

As discussed above, the various flow controllers can control the flow of fluids to the mixers, the mixers (e.g., mixer 106 and mixer 312), which can optionally be static mixers. FIGS. 7A-7F provide diagrammatic representations of one embodiment of a static mixer assembly 700 and its components. Referring to FIG. 7A, static mixer assembly 700 includes a mixer housing 702, an inlet assembly 704 and an outlet assembly 706. Inlet assembly 704 includes two inlets, inlet 708 and inlet 710. These inlets can be coupled to fluid supply lines that lead from upstream flow controllers. For example, inlet 708 can receive hot DIW from hot DIW flow controller 102 and inlet 710 can receive cold DIW from cold DIW flow controller 104. In the example shown in FIG. 7A, inlet assembly 704 has male threaded sections 712 and 714 to connect to inlet supply lines. Similarly, outlet assembly 706 has male threaded section 716 to connect to an outlet line.

FIG. 7B is a partial cutaway of mixer assembly 700 and illustrates a flow path 718 defined through mixer housing 702 from inlet assembly 704 to outlet assembly 706. Thus, fluids entering inlet 708 and inlet 710 of inlet assembly 704 exit a common outlet. FIG. 7B further illustrates that inlet assembly 704 can include a male threaded portion 719 and outlet assembly 706 can include a male threaded portion 720 to couple to mixer housing 702, which has corresponding female threaded portions.

FIG. 7C illustrates another partial cutaway of mixer assembly 700. As shown in FIG. 7C, mixer assembly 700, according to one embodiment of the present invention includes a mixer disk 722 that acts as a static mixer. In the embodiment of FIG. 7C, mixer disk 722 is located in mixer housing 702 at the outlet side of inlet assembly 704. Mixer disk 722 can include a seating flange 724 that rests in a corresponding annular ring of housing assembly 702. Seating flange 724, working in concert with the annular ring as a tongue and groove fitting, can ensure proper seating of mixer disk 722 in mixer housing 702. Additionally, mixer disk 722 can include an annular ring 726 on its upstream side that receives a flange on the outlet side of inlet assembly 704. This also aids in proper seating of mixer disk 722.

By way of example, but not limitation, inlet assembly 704 and outlet assembly 706 are configured to connect to ⅜ inch O.D. tubing with a 0.25 inch bore and flow path 718 has a 0.21 inch diameter. Moreover, the various components of mixer assembly 700, according to one embodiment, can be machined or molded from Teflon or modified Teflon.

FIG. 7D is a diagrammatic representation of one embodiment of mixer disk 722 showing one embodiment of the upstream side. Mixer disk 722, according to one embodiment of the present invention, includes an outer section 728 defined by an outer surface 729 at an outer circumference and an inner surface 730 at an inner circumference 731. Additionally, outer section 728 can include an annular ring 726 that receives, as discussed above, a flange on the outlet side of inlet assembly 704 to aid in seating.

In the embodiment of FIG. 7D, an inner flange 732 projects inwardly from inner surface 730 with an inner flange surface 733 that defines a flow passage. Two radially opposed mixing tabs (tab 736 and 738) further project inwardly towards each other. According to the preferred embodiment, mixing tab 736 and 738 do not touch, but have a small gap between them to leave the center of the flow passage unobstructed. Mixing tab 736 and mixing tab 738 can have downstream surfaces extending approximately normal to inner flange surface 733 and inclined upstream surfaces such that the mixing tabs are thinner near the center of the flow passage and wider proximate to inner flange 732. According to one embodiment, the upstream surfaces of mixing tabs 736 and 738 are inclined approximately fifteen degrees.

Mixer disk 722 can further include an alignment notch 740 to align mixer disk 722 in mixer assembly housing 702. Alignment notch 740 can mate with a corresponding protrusion in mixer assembly housing 702 to align mixer disk 722 to have a particular orientation. For example, mixer disk 722 can be aligned such that mixing tabs are oriented in particular direction.

FIG. 7E is a diagrammatic representation of mixer disk 722 from an upstream view. By way of example, but not limitation, the outer diameter of outer section 728 can be 0.55 inches, and the inner diameter 0.21 inches. The inner diameter of inner flange 732 can further be 0.166 inches. Each of mixing tabs 736 and 738 can extend inwardly 0.074 from inner flange 732 with a gap of 0.018 inches between the mixing tabs. Again, by way of example, annular groove 726 can have an outer diameter of 0.45 inches and a thickness of 0.029 inches. It should be noted that these dimensions are provided by way of example and not limitation and larger or smaller mixing disks can be used. Additionally, the various radii or other example dimensions can be differently proportioned relative to each other.

FIG. 7F is a section view of one embodiment mixer disk 722 along line AA of FIG. 7E. In addition to the features discussed in conjunction with FIG. 7D, FIG. 7F illustrates seating flange 724. In this embodiment, seating flange 724 is an annular ring projecting from the downstream side of mixer disk 722. It can also be noted from FIG. 7F that tabs 736 and 738 can be wedge shaped with the upstream surface of each tab angling 15 degrees inward as it approaches the center of mixer disk 722. The downstream surface, on the other hand, remains perpendicular to the flow passage. The tabs can have other shapes and there can be more than two tabs, or a single tab. Additionally, the dimensions and angles shown in FIG. 7F are provided by way of example, but not limitation.

Figure 8A:
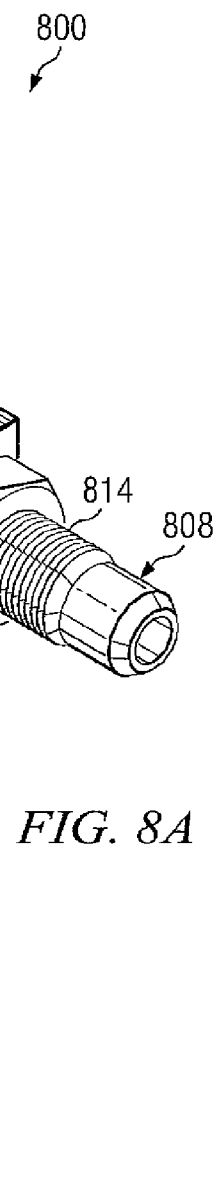
FIGS. 8A-8C provide diagrammatic representations of another embodiment of a mixer assembly.
Figure 8B:
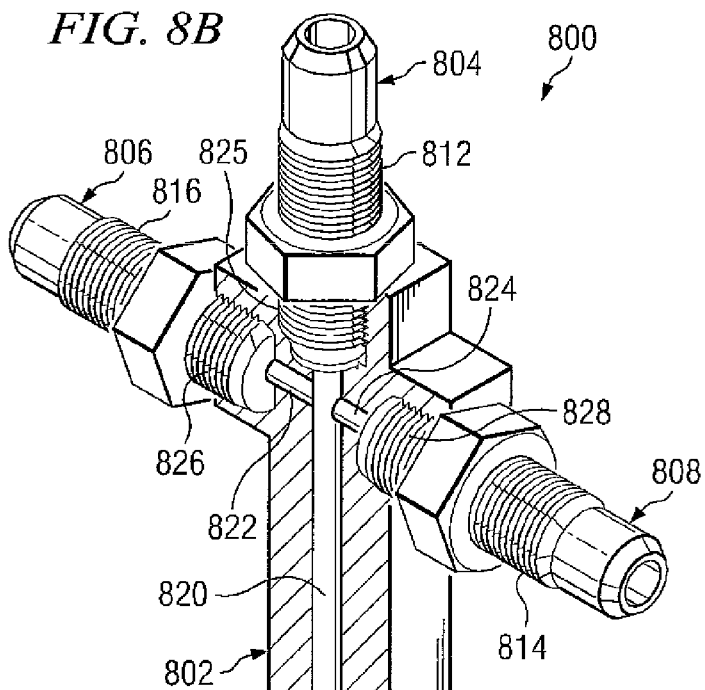
Figure 8C:
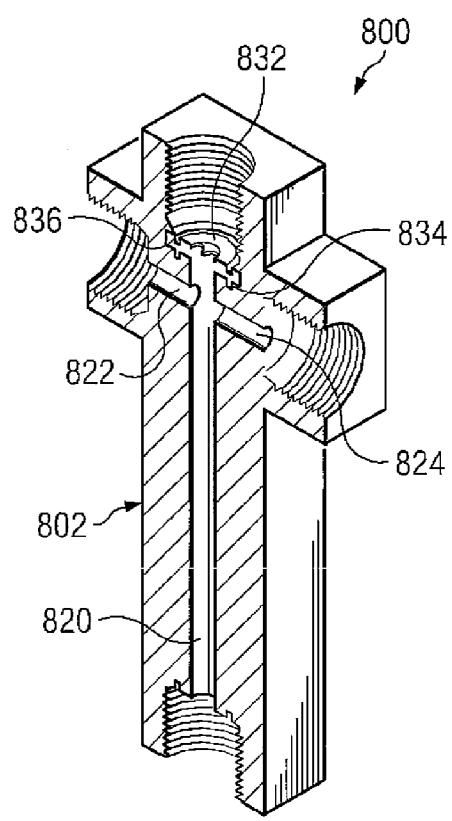

FIGS. 8A-8C provide diagrammatic representations of another embodiment of a mixer assembly. Referring to FIG. 8A, static mixer assembly 800 includes a mixer housing 802, three inlet assemblies 804, 806 and 808 an outlet assembly 810. Each of the inlet assemblies can include an inlet connected by a supply line to supply a fluid. Using the example of the mixing system of FIG. 3, inlet assembly 804 includes an inlet through which the mixed fluid (e.g., mixed DIW) can supplied (e.g., from mixer 106 of FIG. 3) while inlet assemblies 806 and 808 include inlets through which concentrated chemical can be provided by a chemical flow controller (e.g., chemical flow controller 310 of FIG. 3). In the example shown in FIG. 8A, inlet assemblies 804, 806 and 808 have male threaded sections 812, 814 and 816, respectively, to connect to inlet supply lines. Similarly, outlet assembly 810 has male threaded section 818 to connect to an outlet line.

FIG. 8B is a partial cutaway of mixer assembly 800 and illustrates a flow path 820 defined through mixer housing 802 from inlet assembly 804 to outlet assembly 810. Additionally, FIG. 8B illustrates fluid flow paths 822 and 824 through inlet assemblies 806 and 808, respectively, which join with flow path 820. Thus, fluids entering inlet assembly 804, inlet assembly 806 and inlet assembly 808 exit a common outlet. FIG. 78 further illustrates that inlet assembly 804 can include male threaded portion 824, inlet assembly 806 can include male threaded portion 826, inlet assembly 808 includes male threaded portion 828 and outlet assembly 810 can include a male threaded portion 830 to couple to mixer housing 802, which has corresponding female threaded portions.

FIG. 8C illustrates a cross sectional view of one embodiment of mixer assembly 800. As shown in FIG. 5C, mixer assembly 800, according to one embodiment of the present invention, includes a mixer disk 832 that acts as a static mixer. In the embodiment of FIG. 8C, mixer disk 832 is located in mixer housing 802 at the outlet side of inlet assembly 804. Mixer disk 832 can include a seating flange 834 that rests in a corresponding annular ring of housing assembly 802. Seating flange 834, working in concert with the annular ring as a tongue and groove fitting, can ensure proper seating of mixer disk 832 in mixer housing 802. Additionally, mixer disk 832 can include an annular ring 836 that receives a flange on the outlet side of inlet assembly 804. This also aids in proper seating of mixer disk 832.

FIG. 8C also illustrates that flow passages 822 and 824 intersect with flow passage 820 downstream of mixer disk 832. Consequently, in a mixing system such as that depicted in FIG. 3, the concentrated chemical is introduced downstream of mixing disk 822.

By way of example, but not limitation, inlet assembly 804, inlet assembly 806, inlet assembly 808 and outlet assembly 810 are configured to connect to ⅜ inch O.D. tubing with a 0.25 inch bore. By way of example, but not limitation, flow path 218 has a 0.21 inch diameter. The various components of mixer assembly 800, according to one embodiment, can be machined or molded from Teflon or modified Teflon. Mixer disk 822 can be similar or identical to mixer disk 722 of FIGS. 7D-7F. Mixing disk 822 can be aligned (e.g. using the alignment notch) such that the tabs of mixing disk 822 are aligned over flow passage 822 and flow passage 824.

As described above, embodiments of the present invention can provide a fluid mixing system that utilizes various flow controllers (e.g., hot DIW controller 102, cold DIW controller 104 and chemical flow controller 310). According to various embodiments, one of the flow controllers can act as a master controller that communicates set points to the other flow controllers. Thus, the master flow controller is preferably capable of asserting multiple set points.

Many existing flow controllers receive set points as analog voltages/current. Typically, this requires the use of multiple analog sources to provide set points to different flow controllers. However, a particular flow controller may only have one or a limited number of analog ports available. This limits the number of slave flow controllers to which a particular master flow controller can assert set points. Embodiments of the present invention reduce or eliminate the deficiencies associated with having a limited number of analog ports by providing for multiplexing of analog set points on a particular analog communications link.

Figure 9:
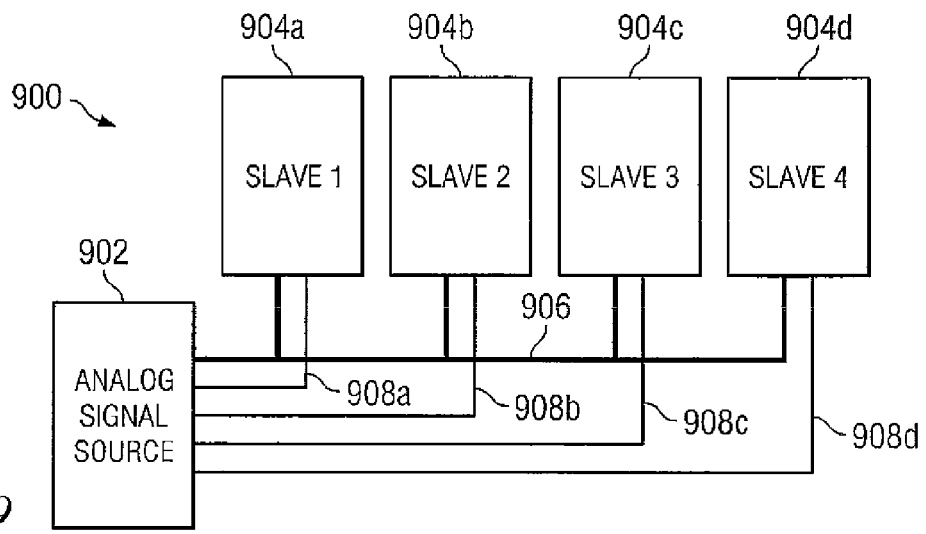
FIG. 9 is a diagrammatic representation of one embodiment of a system for multiplexing analog set points.

FIG. 9 is a diagrammatic representation of one embodiment of a system 900 for multiplexing analog set points. System 900 includes an analog signal source 902 connected to multiple slave devices 904a-904d via an analog communications link 906 and one or more parallel digital communications links 908. Analog signal source 902 can be a flow controller, such as an OptiChem P1200 produced by Mykrolis, Inc. of Billerica, Mass. (now part of Entegris Corporation of Chaska, Minn.). Similarly, devices 904a-904d can also be OptiChem P1200 flow controllers. In other words, one flow controller, acting as analog signal source 902 can act as a master device to other flow controllers. It should be noted, however, that analog signal source 902 can be any device capable of asserting an analog set point and devices 904a-904d can be any devices capable of receiving analog set points.

Analog signal source 902 outputs an analog signal including set points for multiple slave devices on analog communications link 906. Digital communications links 908a-908d can carry set point indicator signals to each of slave devices 904a-904d. It should be noted that the digital communications links can be separate busses or the same bus arbitrated to send a digital signal to a particular slave device 904. A set point indicator signal for a particular slave device indicates that the analog signal is indicating the set point for that slave device. When a particular slave device 904 receives an indication that the analog signal is specifying the set point for that device, the particular slave device 904 can read its set point from the analog signal. Using the set point indicator signals to indicate when set points for particular devices are being asserted on an analog line allows multiple analog set points to be multiplexed on a single analog bus 906.

In FIG. 9, the analog set point signal and set point indicator signals are illustrated as coming from the same master device. However, in other embodiments of the present invention, the analog set point signal and set point indicator signals can be generated at distributed devices.

Figure 10:
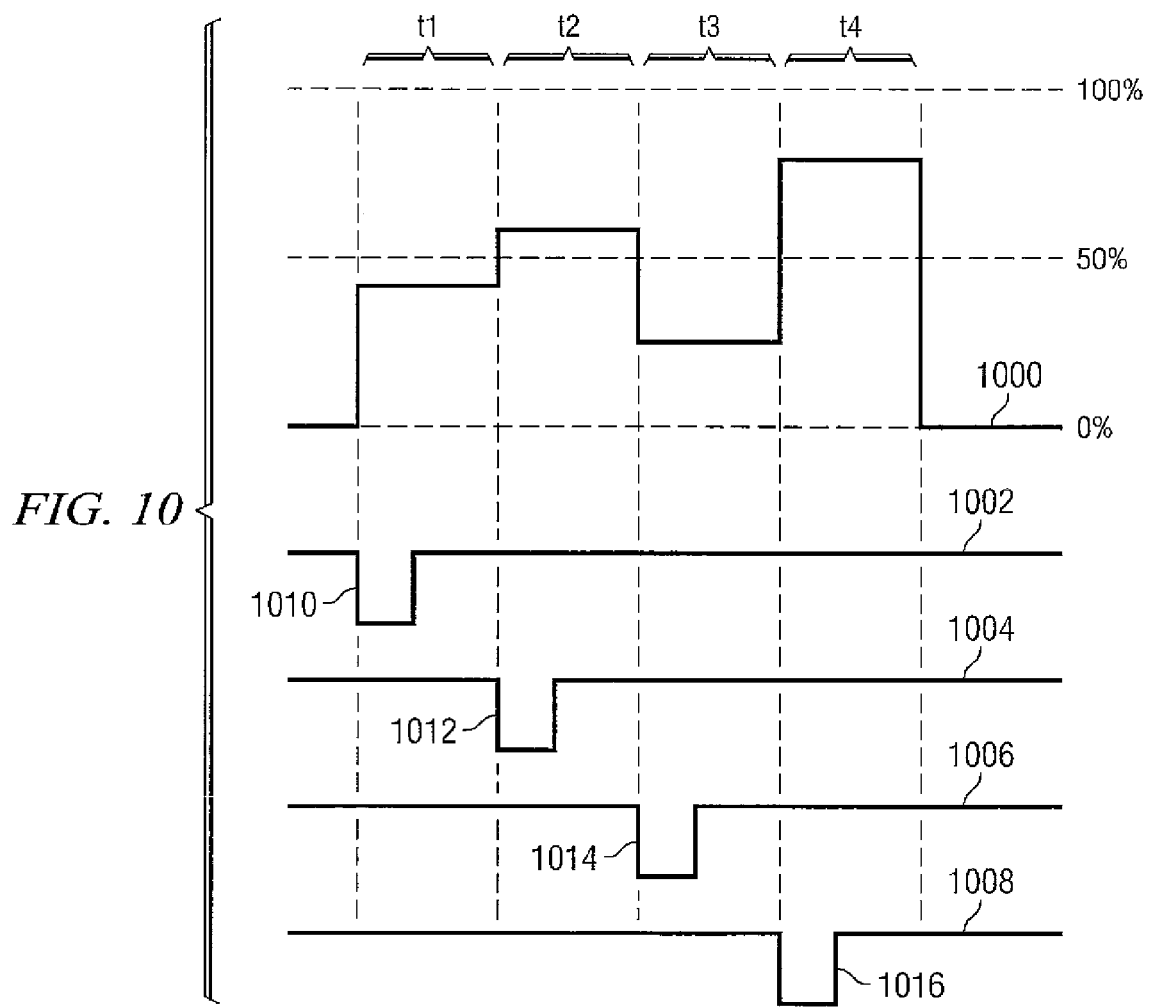
FIG. 10 is a diagrammatic representation of an analog setpoint signal and corresponding setpoint indicator signals.

FIG. 10 illustrates one embodiment of a an analog set point signal 1000 asserted by analog signal source 902, a set point indicator 1002 signal for slave device 904a a set point indicator signal 1004 for slave device 904*b*, a set point indicator signal 1006 for slave device 904*c* and a set point indicator signal 1008 for slave device 904*d*. According to the embodiment illustrated in FIG. 10, analog set point signal 1000 can have voltages/current between 0% and 100% of a full scale value, whereas the set point indicator signals are either high or low (e.g., cycling between +/−3.3 volts or other voltage values or other values indicating a setpoint).

In the example of FIG. 10, four analog set points are multiplexed into analog signal 1000. For time period t1 the set point is 45% of full scale; for time period t2, the set point is 62% of full scale; for time period t3, the set point is 30% of full scale; and for time period t4, the set point is 78% of full scale.

The analog set point values may have different meanings for the various slave devices. For example, the analog set point may correspond to a pressure at slave device 904*a*, but a pump motor speed at slave device 904*b*. Thus, the analog set point signal can multiplex analog set points for a variety of purposes.

During at least part of time period t1, set point indicator signal 1002 changes states from high to low (shown at 1010) indicating that slave device 904*a* should use the 45% of full scale value as its set point. Slave device 904*a* can continue to use this set point value until the set point indicator signal indicates that it should read a new set point from the analog set point signal 1000. Thus, slave device 904*a* can continue to use the 45% of full scale set point even though the value of the analog signal is changing.

Similarly, set point indicator signal 1004 indicates that slave device 904*b* should use the 62% of full scale as its set point (shown at 1012), set point indicator signal 1006 indicates that slave device 904*c* should use the 30% of full scale as its set point (shown at 1014) and set point indicator signal 1008 indicates that slave device 904*d* should use the 78% of full scale as its set point (shown at 1016).

The signal timings provided in FIG. 10 are provided by way of example and any suitable scheme for indicating to a slave device when the analog signal is carrying the set point for that device can be utilized. For example, the set point indicator signal can change states (e.g., from low to high, from high to low or undergo other state change) when the slave device should begin reading its set point from the analog set point signal and change states again when the slave device should stop reading its set point from the analog set point signal. Additionally, the set point indicator can be sent to the slave devices in a variety of manners, including as part of a data stream, an interrupt or in another manner.

According to another embodiment of the present invention, the set point indicator signal can be asserted on multiple digital lines. FIG. 11 is a diagrammatic representation of one embodiment of a system 1100 for multiplexing analog set points. System 1100 includes an analog signal source 1102 connected to multiple slave devices 1104*a*-1104*d* via an analog communications link 1106 and a digital bus 1107. Digital bus 1107 is connected to slave devices 1104*a*-1104*d* at 1108*a*-1108*d* respectively. Digital bus 1107 can include any number of lines for carrying signals to slave devices 1104*a*-1104*d*. In the example of FIG. 11, digital bus has three signaling lines. Analog signal source 1102 can be a flow controller, such as an OptiChem P1200 produced by Mykrolis, Inc. of Billerica, Mass. (now part of Entegris Corporation of Chaska, Minn.). Similarly, devices 1104*a*-1104*d* can also be OptiChem P1200 flow controllers. In other words, one flow controller, acting as analog signal source 1102 can act as a master device to other flow controllers. It should be noted, however, that analog signal source 1102 can be any device capable of asserting an analog set point and devices 1104*a*-1104*d* can be any devices capable of receiving analog set points.

Analog signal source 1102 outputs an analog signal including set points for multiple slave devices on analog communications link 1106. Digital bus 1107 can carry set point indicator signals to each of slave devices 1104*a*-1104*d*. A set point indicator signal for a particular slave device indicates that the analog signal is indicating the set point for that slave device. The set point indicator signal for a particular slave device 1104 can be asserted as multiple bits on bus 1107. For example, the set point indicator for slave device 1104*d* can be bits asserted on the second and third signaling lines of bus 1107 (e.g., 011). When a particular slave device 1104 receives an indication that the analog signal is specifying the set point for that device, the particular slave device 1104 can read its set point from the analog signal. Implementing a binary weighted system for each of the digital select line extends the capabilities of the master without increasing the number of digital setpoint indicator lines.

In FIG. 11, the analog set point signal and set point indicator signals are illustrated as coming from the same master device. However, in other embodiments of the present invention, the analog set point signal and set point indicator signals can be generated at distributed devices.

FIG. 12 illustrates one embodiment of a an analog set point signal 1200 asserted by analog signal source 1102, and digital signals for providing setpoint indicators. According to the embodiment illustrated in FIG. 12, analog set point signal 1200 can have voltages/current between 0% and 100% of a full scale value, whereas the set point indicator signals are either high or low (e.g., cycling between +/−3.3 volts or other voltage values or other values indicating a setpoint).

In the example of FIG. 12, four analog set points are multiplexed into analog signal 1300. For time period t1 the set point is 45% of full scale; for time period t2, the set point is 62% of full scale; for time period t3, the set point is 30% of full scale; and for time period t4, the set point is 78% of full scale.

The analog set point values may have different meanings for the various slave devices. For example, the analog set point may correspond to a pressure at slave device 1104*a*, but a pump motor speed at slave device 1104*b*. Thus, the analog set point signal can multiplex analog set points for a variety of purposes.

During at least part of time period t1 set point signal 1202 changes states from high to low (shown at 1210) indicating that slave device 1104*a* should use the 45% of full scale value as its set point. Slave device 1104*a* can continue to use this set point value until the set point indicator signal indicates that it should read a new set point from the analog set point signal 1200. Thus, slave device 1104*a* can continue to use the 45% of full scale set point even though the value of the analog signal is changing.

Similarly, signal 1204 indicates that slave device 1104*b* should use the 62% of full scale as its set point (shown at 1212), signal 1206 indicates that slave device 1104*c* should use the 30% of full scale as its set point (shown at 1314). In time $t_4$, signals 1204 and 1206 assert a bit (shown at 1216 and 1218), indicating that slave device 1104*d* should use the 78% of full scale as its set point (i.e., multiple digital lines are used to send the setpoint indicator to slave device 1104*d*). Thus, three set point indicator lines are used to indicate setpoint to four slave devices. Using a binary scheme up to 7 slave devices can be supported ($2^n-1$, where n is the number of setpoint indicator lines) with one signal state reserved for the case in which no setpoint is being asserted for a device.

The signal timings provided in FIG. 12 are provided by way of example and any suitable scheme for indicating to a slave device when the analog signal is carrying the set point for that device can be utilized. For example, the set point indicator signal can change states (e.g., from low to high, from high to low or undergo other state change) when the slave device should begin reading its set point from the analog set point signal and change states again when the slave device should stop reading its set point from the analog set point signal. Additionally, the set point indicator can be sent to the slave devices in a variety of manners, including as part of a data stream, an interrupt or in another manner.

Figure 13:
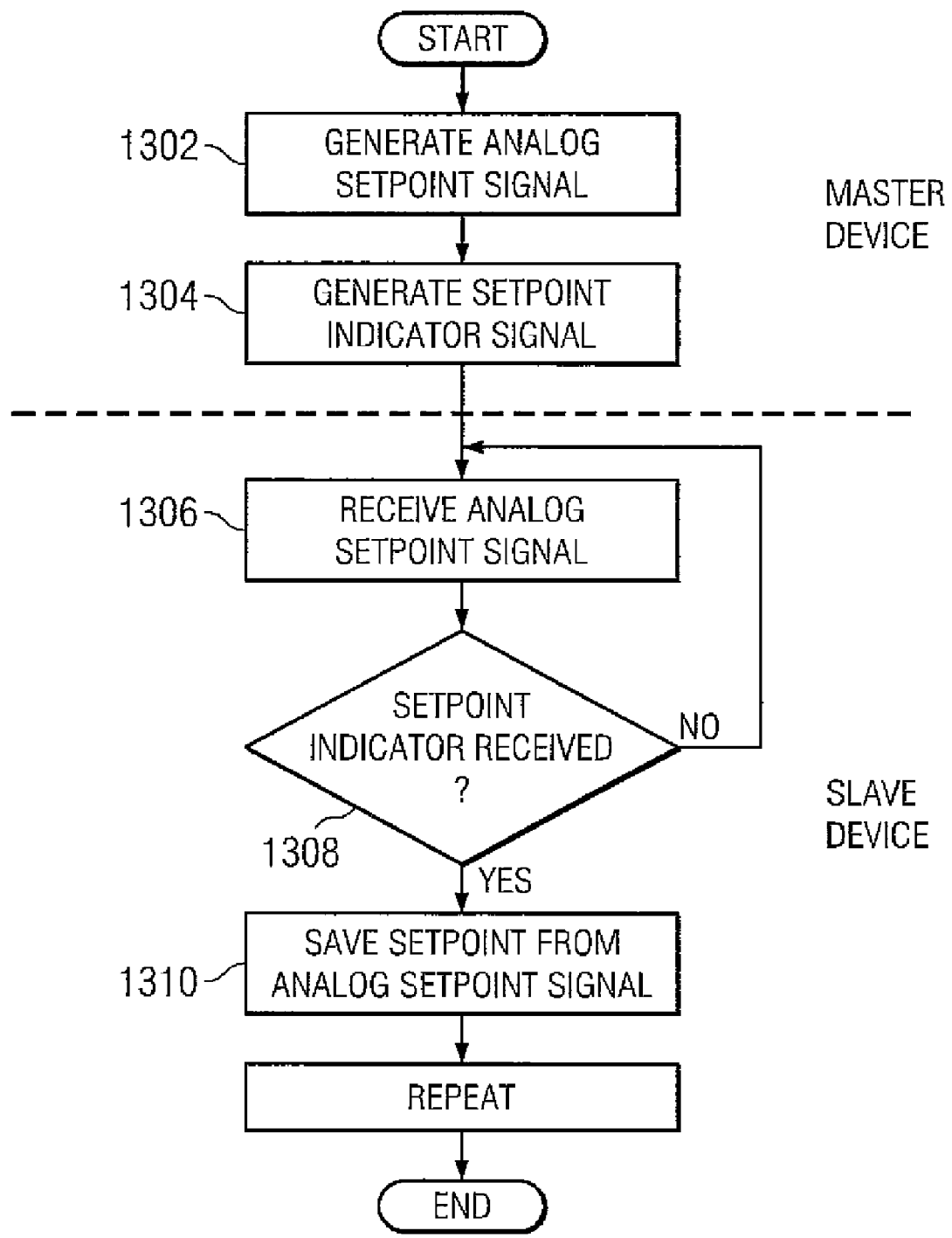
FIG. 13 is a flow chart illustrating one embodiment of multiplexing analog setpoints.

FIG. 13 is a flow chart illustrating one embodiment of a method for multiplexing analog set points. The flow chart is divided into two sections for the master and slave device. The methodology of FIG. 13 can be implemented, for example, by execution of computer instructions at the master, slave or other devices.

According to one embodiment, an analog signal source generates an analog signal representing multiple set points (step 1302). Put another way, multiple analog set points are multiplexed in the analog signal. The master device communicates the analog signal to the slave devices. When the set point for a particular slave device is being transmitted via the analog signal, the master device can send a set point indicator to that slave device (step 1304). For example, the master device can use a signal on a digital bus (e.g., by changing the state of a line or lines on the bus) to indicate to a particular slave device that its set point is being asserted on the analog line. The routine can continue until a predefined event occurs to end the routine.

The slave device can receive the analog set point signal (step 1306). When the slave device receives a set point indicator indicating that the analog set point signal is asserting that slave device's set point (e.g., as determined at 1308), the slave device can save the value of the analog set point signal and store the signal as its set point (step 1310). This routine can continue until a predefined event occurs to end the routine. Additionally, the steps of FIG. 13 can be repeated as needed or desired.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed in the following claims.

What is claimed is:

1. A fluid mixing method comprising:
   providing a first fluid and a second fluid to a first mixer;
   mixing the first fluid and the second fluid at the first mixer to produce a first mixed fluid;
   measuring the temperature of the first mixed fluid;
   calculating a first fluid target flow rate;
   regulating the flow of the first fluid to the first mixer and thereby driving the flow rate of the first mixed fluid toward the first fluid target flow rate;
   calculating a temperature setpoint; and
   regulating the flow of the second fluid to the first mixer and thereby driving the temperature of the first mixed fluid toward the temperature setpoint.

2. The fluid mixing method of claim 1, further comprising:
   determining the target flow rate of the first fluid based on a first fluid temperature, a second fluid temperature, a target temperature of the first mixed fluid, and a first mixed fluid target flow rate.

3. The fluid mixing method of claim 1, further comprising:
   determining the temperature setpoint at a first flow controller that regulates the flow of the first fluid; and
   providing the temperature setpoint to a second flow controller that regulates the flow of the second fluid.

4. The fluid mixing method of claim 3, further comprising:
   setting the temperature setpoint equal to a target temperature for the first mixed fluid.

5. The fluid mixing method of claim 1, further comprising:
   mixing the first mixed fluid with a third fluid at a second mixer to produce a second mixed fluid; and
   measuring the temperature of the second mixed fluid.

6. The fluid mixing method of claim 5, further comprising:
   determining a first mixed fluid target flow rate based on a second mixed fluid target flow rate of and a target mix ratio of the second mixed fluid.

7. The fluid mixing method of claim 6, further comprising:
   adjusting the temperature setpoint based on the temperature of the second mixed fluid.

8. The fluid mixing method of claim 7, further comprising:
   adjusting the first fluid target flow rate based on the temperature of the second mixed fluid.

9. The fluid mixing method of claim 1, wherein regulating the flow of the first fluid to the first mixer is performed independently of regulating the flow of the second fluid to the first mixer.

10. A method for mixing fluids, comprising:
    supplying a first fluid having a first temperature and a second fluid having a second temperature to a first mixer;
    mixing the first fluid and the second fluid at the first mixer to produce a first mixed fluid having a third temperature;
    calculating a first fluid target flow rate;
    regulating the flow of the first fluid to the first mixer based on the first fluid target flow rate;
    calculating a temperature setpoint; and
    regulating the flow of the second fluid to the first mixer based on the third temperature of the first mixed fluid and the temperature setpoint.

11. The method of claim 10, further comprising:
    in response to a trigger signal, adjusting the flow of the first fluid to the first mixer, the flow of the second fluid to the first mixer, or both.

12. The method of claim 10, further comprising:
    determining the temperature setpoint at a first flow controller that regulates the flow of the first fluid; and
    providing the temperature setpoint to a second flow controller that regulates the flow of the second fluid.

13. The method of claim 12, wherein the first temperature of the first fluid is lower than a target temperature.

14. The method of claim 13, wherein the second temperature of the second fluid is higher than the target temperature.

15. The method of claim 12, further comprising:
    setting the temperature setpoint equal to a target temperature for the first mixed fluid.

16. The method of claim 10, further comprising:
    mixing the first mixed fluid with a third fluid at a second mixer to produce a second mixed fluid; and
    measuring the temperature of the second mixed fluid.

17. The method of claim 16, further comprising:
    determining a first mixed fluid target flow rate based on a second mixed fluid target flow rate of and a target mix ratio of the second mixed fluid.

18. The method of claim 17, further comprising:
    adjusting the temperature setpoint based on the temperature of the second mixed fluid.

19. The method of claim 18, further comprising:
    adjusting the first fluid target flow rate based on the temperature of the second mixed fluid.

20. A fluid mixing method comprising:
    receiving inputs including a target mixed fluid temperature, a target mixed fluid flow rate, a first fluid temperature, and a second fluid temperature;
    calculating a first fluid flow rate utilizing the inputs;

setting a temperature set point to the target mixed fluid temperature;

providing a first fluid and a second fluid to a first mixer;

mixing the first fluid and the second fluid at the first mixer to produce a mixed fluid;

regulating the flow of the first fluid using the first fluid flow rate; and adjusting a second fluid flow rate of the second fluid based on a measured temperature of the mixed fluid and the temperature set point.

* * * * *